United States Patent
Cao et al.

(10) Patent No.: US 8,957,502 B2
(45) Date of Patent: Feb. 17, 2015

(54) SEMICONDUCTOR DEVICE

(71) Applicant: Fuji Electric Co., Ltd., Kawasaki (JP)

(72) Inventors: Dawei Cao, Matsumoto (JP); Yasuhiko Onishi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/711,856

(22) Filed: Dec. 12, 2012

(65) Prior Publication Data

US 2013/0181328 A1  Jul. 18, 2013

(30) Foreign Application Priority Data

Jan. 18, 2012 (JP) ................................ 2012-008529

(51) Int. Cl.

| H01L 29/06 | (2006.01) |
|---|---|
| H01L 29/40 | (2006.01) |
| H01L 29/739 | (2006.01) |
| H01L 29/78 | (2006.01) |
| H01L 29/861 | (2006.01) |
| H01L 29/872 | (2006.01) |
| H01L 29/08 | (2006.01) |
| H01L 29/10 | (2006.01) |

(52) U.S. Cl.
CPC .......... *H01L 29/0657* (2013.01); *H01L 29/404* (2013.01); *H01L 29/7395* (2013.01); *H01L 29/7811* (2013.01); *H01L 29/8611* (2013.01); *H01L 29/872* (2013.01); *H01L 29/0619* (2013.01); *H01L 29/0634* (2013.01); *H01L 29/0878* (2013.01); H01L 29/0696 (2013.01); H01L 29/1095 (2013.01)

USPC .......................................... 257/618; 257/341

(58) Field of Classification Search
CPC ............ H01L 29/0657; H01L 29/0661; H01L 29/0646; H01L 29/0623; H01L 29/0692; H01L 29/0696
USPC ........... 257/341, 197, E29.005, E29.012, 618
See application file for complete search history.

(56) References Cited

U.S. PATENT DOCUMENTS

| 6,274,904 | B1 | 8/2001 | Tihanyi |
| 6,512,268 | B1 * | 1/2003 | Ueno ............................ 257/341 |
| 2003/0176031 | A1 | 9/2003 | Onishi et al. |
| 2009/0194786 | A1 | 8/2009 | Iwamoto et al. |

(Continued)

FOREIGN PATENT DOCUMENTS

| JP | 2000-101082 A | 4/2000 |
| JP | 2003-224273 A | 8/2003 |

(Continued)

*Primary Examiner* — Caridad Everhart
(74) *Attorney, Agent, or Firm* — Rossi, Kimms & McDowell LLP

(57) ABSTRACT

A semiconductor device is disclosed that has enhanced its electric charge resistance. A first parallel p-n layer is disposed in an element activating part, and a second parallel p-n layer is disposed in an element peripheral edge part. An $n^-$ surface area is disposed between the second parallel p-n layer and a first principal face. Two or more p-type guard ring areas are disposed so as to be separate from each other on the first principal face side of the $n^-$ surface area. First field plate electrodes and second field plate electrodes are electrically connected to p-type guard ring areas. Second field plate electrodes cover the first field plate electrodes adjacent to each other so as to cover the first principal face between the first field plate electrodes through a second insulating film.

19 Claims, 23 Drawing Sheets

(56) References Cited

U.S. PATENT DOCUMENTS

| | | |
|---|---|---|
| 2011/0049616 A1* | 3/2011 | Saggio et al. .................. 257/329 |
| 2011/0115007 A1* | 5/2011 | Wahl et al. .................... 257/296 |
| 2011/0204442 A1* | 8/2011 | Guan et al. .................... 257/342 |
| 2012/0126315 A1 | 5/2012 | Onishi et al. |
| 2012/0273871 A1* | 11/2012 | Yedinak et al. ............... 257/329 |

FOREIGN PATENT DOCUMENTS

| | | |
|---|---|---|
| JP | 2009-187994 A | 8/2009 |
| WO | 2011/013379 A1 | 2/2011 |

\* cited by examiner

SEMICONDUCTOR DEVICE

BACKGROUND OF THE INVENTION

A. Field of the Invention

The present invention relates to a semiconductor device.

B. Description of the Related Art

Generally, semiconductor devices are classified into a horizontal-type element in which electrodes are formed on one face of a semiconductor substrate and a vertical-type element in which electrodes are formed on both faces of a semiconductor substrate. In the vertical-type semiconductor device, a direction in which a drift current flows in the on-state and a direction in which a depletion layer grows in accordance with a reverse bias voltage in the off-state are the same. In a general planar-type n channel vertical-type MOSFET (insulated gate-type electric field effect transistor), a high-resistance n⁻ drift layer part serves as an area that causes a drift current to flow in the vertical direction in the on-state. Accordingly, by shortening the current path in the n⁻ drift layer, the drift resistance is lowered, and there is an advantage of lowering the substantial on-resistance of the MOSFET.

On the other hand, the high-resistance n⁻ drift layer part is depleted so as to increase the breakdown voltage in the off-state. Accordingly, when the n⁻ drift layer is thin, a spread width of a depletion layer between the drain and the base that advances from a p-n junction between a p-base area and the n⁻ drift layer decreases, and the threshold electric field intensity of silicon is reached quickly, and the breakdown voltage decreases. In contrast to this, in a semiconductor device having a high breakdown voltage, since the n⁻ drift layer is thick, the on-resistance is high, whereby the loss increases. As above, there is a trade-off relation between the on-resistance and the breakdown voltage.

It is known that such a trade-off relation similarly is formed in semiconductor devices such as an insulated gate bipolar transistor (IGBT), a bipolar transistor, and a diode. In addition, such a trade-off relation is common to horizontal-type semiconductor devices in which a direction in which a drift current flows in the on-state and a direction in which the depletion layer grows in accordance with a reverse bias in the off-state are different from each other.

As a solution for a problem according to the above-described tradeoff relation, a superjunction semiconductor device is known in which a drift layer is formed to have a parallel p-n structure having a configuration acquired by repeatedly bonding in an alternate manner an n-type area and a p-type area, of which the impurity densities are increased. In the semiconductor device having such a structure, by configuring total amounts of impurities of the n-type area and the p-type area of the parallel p-n structure to be the same as a whole, low on-resistance can be acquired while the breakdown voltage is maintained. Accordingly, in order to maintain the breakdown voltage of the semiconductor device having such a structure, it is necessary to control the total amounts of impurities of the n-type area and the p-type area of the parallel p-n structure with high accuracy.

In order to realize a high breakdown voltage of a semiconductor device, an element peripheral edge part structure is necessary. In a case where there is no element terminal structure, the electric field is high at the terminal of the drift layer so as to decrease the breakdown voltage, whereby it is difficult to realize a high breakdown voltage. As a structure for solving such a problem, it has been proposed to arrange a parallel p-n structure having a pitch smaller than that of the parallel p-n structure of an element activating part in a surface-side area of the outer circumference of the parallel p-n structure of the element activating part (see, for example, JP 2003-224273 A). According to the proposal, the surface electric field near the element activating part is alleviated, so that a high breakdown voltage is maintained.

In addition, even when a high breakdown voltage is maintained, in a semiconductor device having no electric charge resistance, the breakdown voltage decreases with the passage of time and accordingly it is difficult to assure the reliability of the breakdown voltage. As a structure for solving such a problem, a structure has been proposed in which an n⁻ surface area is arranged in a surface-side area of a parallel p-n structure of an element peripheral edge part, and a field plate electrode that is electrically connected to a p-type guard ring area disposed inside the n⁻ surface area is arranged on the surface of the n⁻ surface area (see, for example, WO 2011/013379 A). According to such a proposal, a decrease in the breakdown voltage according to positive electric charge and negative electric charge can be suppressed.

As a semiconductor device that includes a p-type guard ring area and a field plate electrode, a semiconductor device having a configuration has been proposed in which a forward/reverse breakdown voltage structure unit includes first field limiting rings (FLRs), which are deep, disposed on the inner peripheral side, and second FLRs, which are shallow, disposed on the outer peripheral side, and insulating films that cover surfaces between a plurality of the first and second FLRs on the surface layer, and a conductive field plate that is in contact with the surfaces of a plurality of the FLRs overhang the surfaces of the insulating films disposed between the plurality of FLRs (see, for example, JP 2009-187994 A). In addition, as another device, a semiconductor device has been proposed in which, within the area of the upper face of the semiconductor unit, which has one conductivity type, a protection ring having the other conductivity type is disposed, and the protection ring is connected to a field plate (see, for example, JP 2000-101082 A and U.S. Pat. No. 6,274,904).

However, in a semiconductor device having low electric charge resistance, even when an initial breakdown voltage can be secured, the breakdown voltage decreases with the passage of time, and accordingly, there is a problem in that it is difficult to assure the reliability of the breakdown voltage. For example, in the semiconductor device disclosed in JP 2003-224273 A, when positive electric charge is present on an oxide film between the field plate electrode and a channel stopper electrode, it is difficult for the depletion layer to spread and therefore the electric field at the end of the field plate becomes high, such that there is a problem in that the breakdown voltage decreases. In the semiconductor devices disclosed in JP 2009-187994 A, JP 2000-101082 A, and U.S. Pat. No. 6,274,904, a parallel p-n layer is not disposed in the element peripheral edge part, and accordingly, there is a problem in that it is difficult to achieve a high breakdown voltage.

In addition, for example, in the semiconductor device disclosed in WO 2011/013379 A there are the following problems. FIG. 23 is a cross-sectional view that illustrates the configuration of a conventional semiconductor device. FIG. 23 is the superjunction semiconductor device that is disclosed in WO 2011/013379 A. As illustrated in FIG. 23, the conventional semiconductor device has element activating part 1 in which the surface structure of the element is disposed on a first principal face side, and element peripheral edge part 130 that surrounds element activating part 1 is disposed on the outer side of element activating part 1. On the first principal face side of element peripheral edge part 130, n⁻ surface area 119 is disposed. On the first principal face side of n⁻ surface area 119, three p-type guard ring areas 120a, 120b, and 120c are disposed so as to be separate from each other. The impurity density of p-type guard ring areas 120a, 120b, and 120c is higher than the impurity density of n⁻ surface area 119.

In such a conventional semiconductor device, by arranging n⁻ surface area 119 and p-type guard ring areas 120a, 120b, 120c, a high electric field near the outer circumference of element activating part 1 due to the presence of positive electric charge (positive ions) on oxide film 121 between field plate electrode 122 and channel stopper electrode 123 is alleviated. Accordingly, variations in the breakdown voltage due to the positive electric charge can be suppressed. However, in a case where there is positive electric charge of $+1.0\times10^{12}$ cm$^{-2}$ or more between field plate electrode 122 and channel stopper electrode 123, even when n⁻ surface area 119 is disposed on the first principal face side, it is difficult for the depletion layer to spread. Accordingly, the electric field becomes high at the end of field plate electrode 122, and therefore, the breakdown voltage decreases.

On the other hand, in a case where negative electric charge (negative ions) is present between field plate electrode 122 and channel stopper electrode 123, the depletion layer is prevented from reaching through the terminal of element peripheral edge part 130 due to field plate electrode 122 connected to p-type guard ring area 120c that is located on the outermost side. Accordingly, a decrease in the breakdown voltage due to negative electric charge can be suppressed. However, in a case where there is negative electric charge of $-1.0\times10^{12}$ cm$^{-2}$ or less between field plate electrode 122 and channel stopper electrode 123, it is easy for the depletion layer to spread up to the end of channel stopper electrode 123 due to the arrangement of n⁻ surface area 119 on the first principal face side. Therefore, the electric field becomes high at the end of channel stopper electrode 123, and therefore the breakdown voltage decreases.

As above, in the semiconductor device disclosed in WO 2011/013379 A, although the electric charge resistance of the breakdown voltage is considered, only electric charge resistance of a case where the amount Qss of the surface electric charge is $-1.0\times10^{12}$ cm$^{-2}$ or more and $+1.0\times10^{12}$ cm$^{-2}$ or less is secured. Accordingly, for a mold resin having a high impurity ion density, the electric charge resistance of the breakdown voltage is not sufficiently considered, and therefore there is concern that the breakdown voltage may decrease. In order to provide a superjunction semiconductor device having high reliability by avoiding a decrease in the breakdown voltage, it is necessary additionally to improve the electric charge resistance.

The present invention is directed to overcoming or at least reducing the effects of one or more of the problems set forth above.

SUMMARY OF THE INVENTION

The present invention provides a semiconductor device capable of improving the electric charge resistance.

A semiconductor device according to this invention has the following aspects. An element activating part is disposed on a first principal face side. A low-resistance layer is disposed on a second principal face side. A parallel p-n layer, in which a first conductivity type area and a second conductivity type area are alternately arranged, is disposed between a first principal face and the low-resistance layer. A third first-conductivity type area is disposed between the parallel p-n layer and the first principal face in an element peripheral edge part that surrounds the element activating part. Two or more third second-conductivity type areas are disposed to be separate from each other on the first principal face side of the third first-conductivity type area. Two or more first conductive layers that are connected to the third second-conductivity type areas on the first principal face side are disposed. The two or more first conductive layers partially cover the first principal face in the element peripheral edge part. Two or more second conductive layers are electrically connected to the third second-conductivity type areas and cover the first conductive layers adjacent to each other so as to cover the first principal face between the first conductive layers through an insulating layer.

According to this invention, the third second-conductivity type area having a ring shape is disposed on the first principal face side of the element peripheral edge part, and the first principal face of the element peripheral edge part is completed covered with the first and second conductive layers that are electrically connected to the third second-conductivity type area. Accordingly, even in a case where electric charge (ions) arrives on the insulating film of the element peripheral edge part, the influence of the electric charge on the breakdown voltage is almost blocked by the first and second conductive layers. Therefore, there is no influence on the distribution of an electric potential, an electric field, or the like inside the element, and high electric charge resistance is easily realized.

In addition, the semiconductor device according to this invention has the following additional aspects. The repetition pitch of the parallel p-n layers in the element peripheral edge part may be smaller than the repetition pitch of the parallel p-n layers in the element activating part. More specifically, between the element activating part and the low-resistance layer, the first parallel p-n layer is disposed in which the first first-conductivity type area and the first second-conductivity type area are alternately arranged. A second parallel p-n layer, in which a second first-conductivity type area and a second second-conductivity type area are alternately arranged with a pitch that is smaller than the repetition pitch of the first first-conductivity type area and the first second-conductivity type area, is disposed in the element peripheral edge part.

According to this invention, since the repetition pitch of the second parallel p-n layer arranged in the element peripheral edge part is smaller than the repetition pitch of the first parallel p-n layer, a depletion layer easily spreads in the element peripheral edge part. Therefore, a high breakdown voltage can be realized.

A space between the third second-conductivity type areas adjacent to each other may further increase toward a terminal of the element peripheral edge part according to the invention.

According to this invention, a high electric field near the outer circumference of the element activating part that can be easily influenced by the electric charge (ions) can be relieved, and accordingly, the electric charge resistance of the breakdown voltage is improved.

In a semiconductor device according to this invention, a width of a part of the first conductive layer that is located on the element activating part side may be larger toward the terminal of the element peripheral edge part than that of the second conductive layer that is connected to the third second-conductivity type area to which the first conductive layer is electrically connected.

In a semiconductor device according to this invention, the width of the second conductive layer may further increase toward the terminal of the element peripheral edge part.

In a semiconductor device according to this invention, a fourth first-conductivity type area that has an impurity density higher than the third first-conductivity type area is arranged in the third first-conductivity type area.

In a semiconductor device according to this invention the fourth first-conductivity type area is disposed between the third second-conductivity type areas that are adjacent to each other.

According to this invention, each electric potential that is applied between the third second-conductivity type areas can be uniformly shared.

A semiconductor device according to this invention further includes the following aspects. Planar shapes of the first first-conductivity type area and the first second-conductivity type area are stripes. Planar shapes of the second first-conductivity type area and the second second-conductivity type area may be stripes or a planar shape of any one of the second first-conductivity type area and the second second-conductivity type area may be squares or polygons.

According to this invention, even in a case where the planar shape of the parallel p-n layer is a stripe, a square, or a polygon, the electric charge resistance of the breakdown voltage is improved.

According to a semiconductor device of this invention, an impurity density of the third first-conductivity type area is $2 \times 10^{14}$ cm$^{-3}$ or more and $8 \times 10^{14}$ cm$^{-3}$ or less.

The semiconductor device according to the invention may include the following features. An element activating part is disposed on a first principal face side. A low-resistance layer is disposed on a second principal face side. A first parallel p-n layer, in which a first first-conductivity type area and a first second-conductivity type area are alternately arranged, is disposed between the element activating part and the low-resistance layer. A second parallel p-n layer, in which a second first-conductivity type area and a second second-conductivity type area are alternately arranged with a pitch that is smaller than a repetition pitch of the first first-conductivity type area and the first second-conductivity type area, is disposed in the element peripheral edge part that surrounds the element activating part. Two or more third second-conductivity type areas are disposed to be separate from each other on the first principal face side of the second parallel p-n layer. Two or more first conductive layers that are electrically connected to the third second-conductivity type areas on the first principal face side are disposed. The two or more first conductive layers partially cover the first principal face in the element peripheral edge part. Two or more second conductive layers are disposed, which are electrically connected to the third second-conductivity type areas and cover the first conductive layers adjacent to each other so as to cover the first principal face between the first conductive layers through an insulating layer. Planar shapes of the first first-conductivity type area and the first second-conductivity type area are stripes, and a planar shape of any one of the second first-conductivity type area and the second second-conductivity type area is a square or a polygon.

According to this invention, the third second-conductivity type area having a ring shape is disposed on the first principal face side of the element peripheral edge part, and the first principal face of the element peripheral edge part is completely covered with the first and second conductive layers that are electrically connected to the third second-conductivity type area. Accordingly, even in a case where electric charge (ions) arrives on the insulating film of the element peripheral edge part, the influence of the electric charge on the breakdown voltage is almost blocked by the first and second conductive layers. Therefore, there is no influence on the distribution of an electric potential, an electric field, or the like inside the element, and the electric charge resistance of the breakdown voltage is improved. In addition, by configuring the planar shape of any one of the second first-conductivity type area and the second second-conductivity type area that configure the second parallel p-n layer of the element peripheral edge part to be a square or a polygon, the electric charge resistance of the breakdown voltage is improved without arranging the third first-conductivity type area on the first principal face side of the element peripheral edge part. Accordingly, the process for forming the third first-conductivity type area may not be performed, therefore a semiconductor device can be provided at low price.

In addition, according to a semiconductor device of this invention, a planar shape of any one of the second first-conductivity type area and the second second-conductivity type area may be a lattice pattern.

According to this invention, the electric charge resistance of the breakdown voltage is improved without arranging the third first-conductivity type area on the first principal face side of the element peripheral edge part. Accordingly, the process for forming the third first-conductivity type area may not be performed, therefore a semiconductor device can be provided at low price.

Furthermore, according to a semiconductor device of this invention, a space between the third second-conductivity type areas adjacent to each other may further increase toward a terminal of the element peripheral edge part.

According to this invention, a high electric field near the outer circumference of the element activating part that can be easily influenced by the electric charge (ions) can be relieved, and accordingly, the electric charge resistance of the breakdown voltage is improved.

In addition, according to a semiconductor device of this invention, a width of a part of the first conductive layer that is located on the element activating part side may be further larger toward the terminal of the element peripheral edge part than that of the second conductive layer that is connected to the third second-conductivity type area to which the first conductive layer is electrically connected.

Furthermore, according to a semiconductor device of this invention, the width of the second conductive layer may further increase toward the terminal of the element peripheral edge part.

In addition, according to a semiconductor device of this invention, the whole first principal face of the element peripheral edge part may be covered with two or more first conductive layers and two or more second conductive layers.

According to this invention, each electric potential that is applied between the third second-conductivity type areas can be uniformed shared.

According to a semiconductor device of the present invention, there is an advantage in that the electric charge resistance can be improved.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
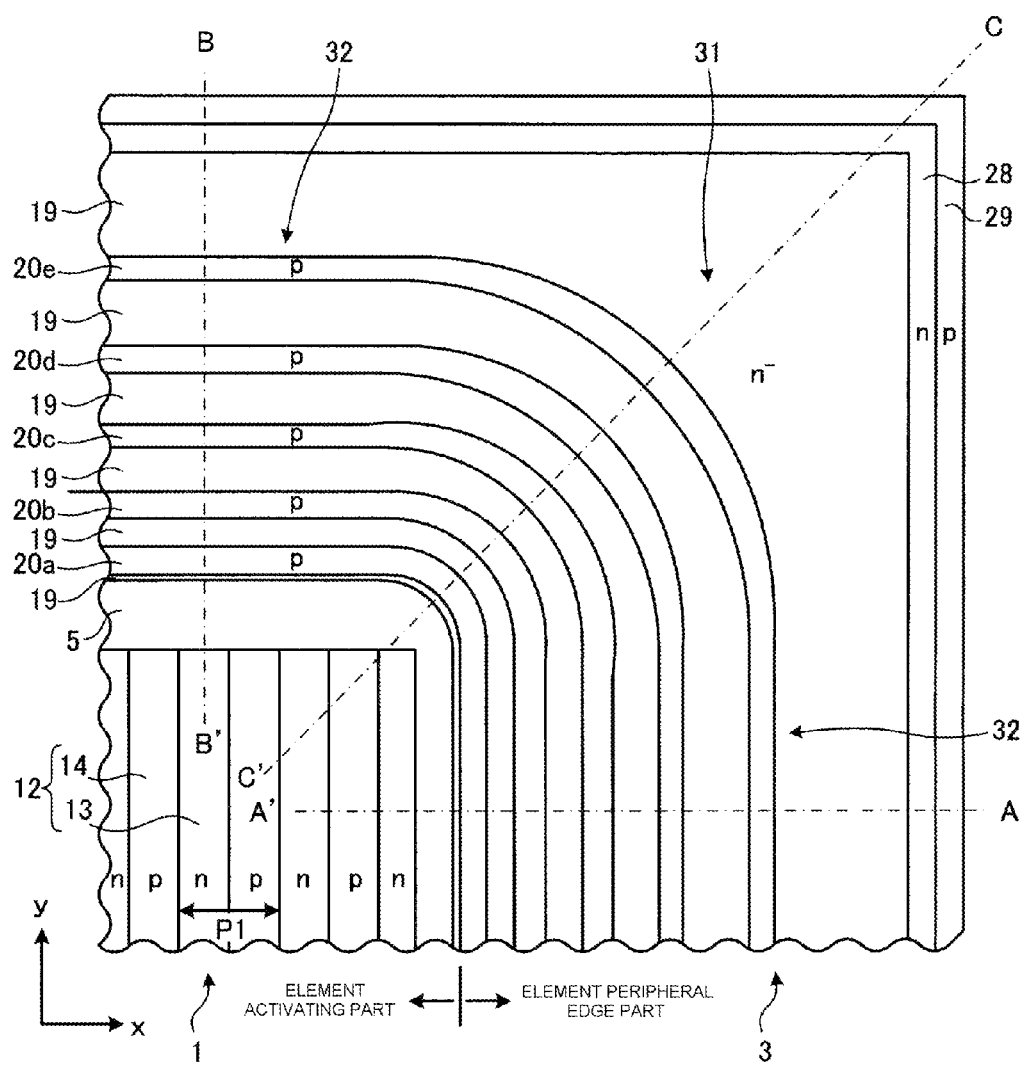
FIG. 1 is a plan view of a semiconductor device according to a first embodiment.

Hereinafter, semiconductor devices according to preferred embodiments of the invention will be described in detail with reference to the accompanying drawings. In description presented here and in the accompanying drawings, a layer or an area that is denoted by n or p represents that electrons or holes are majority carriers. In addition, "+" or "−" added to n or p represents an impurity density that is higher or lower than that of a layer or area to which "+" or "−" is not added. In description of the following embodiments and the accompanying drawings, the same reference numeral is assigned to the same configuration, and duplicate description will not be presented.

First Embodiment

Figure 2:
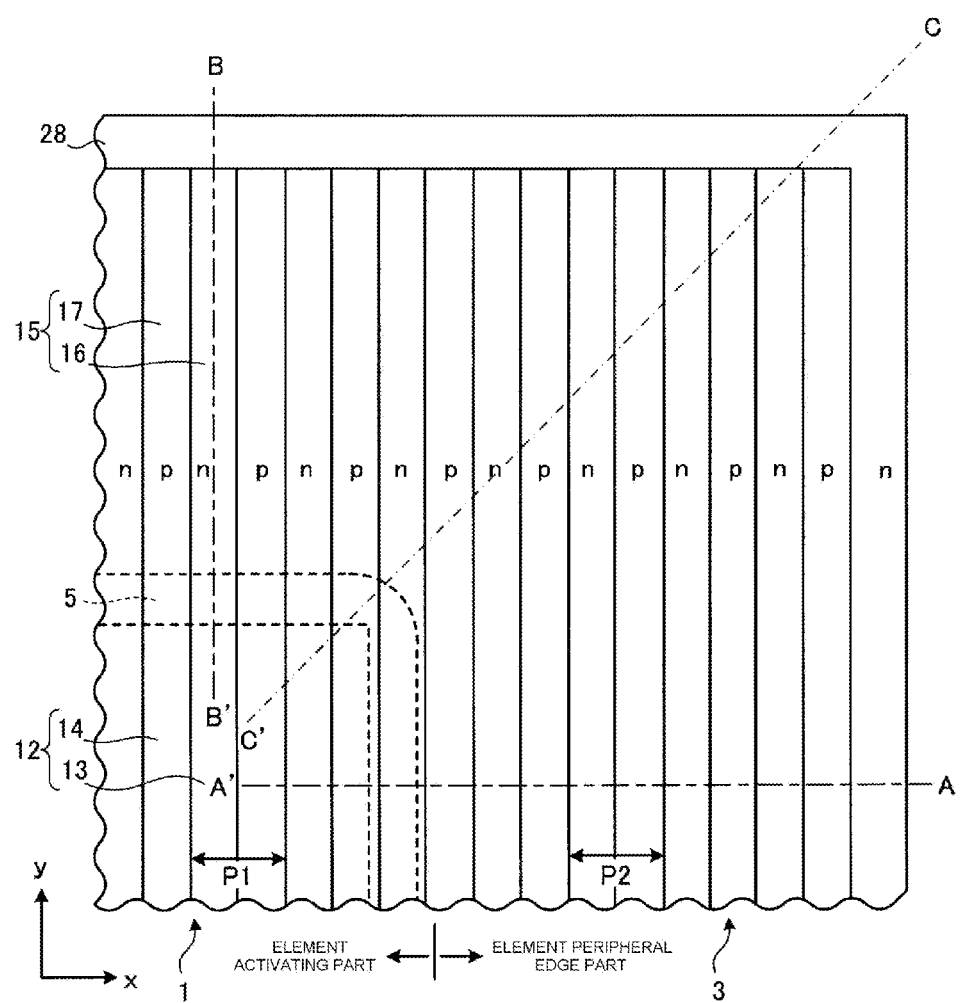
FIG. 2 is a transverse cross-sectional view of the semiconductor device according to the first embodiment.
Figure 3:
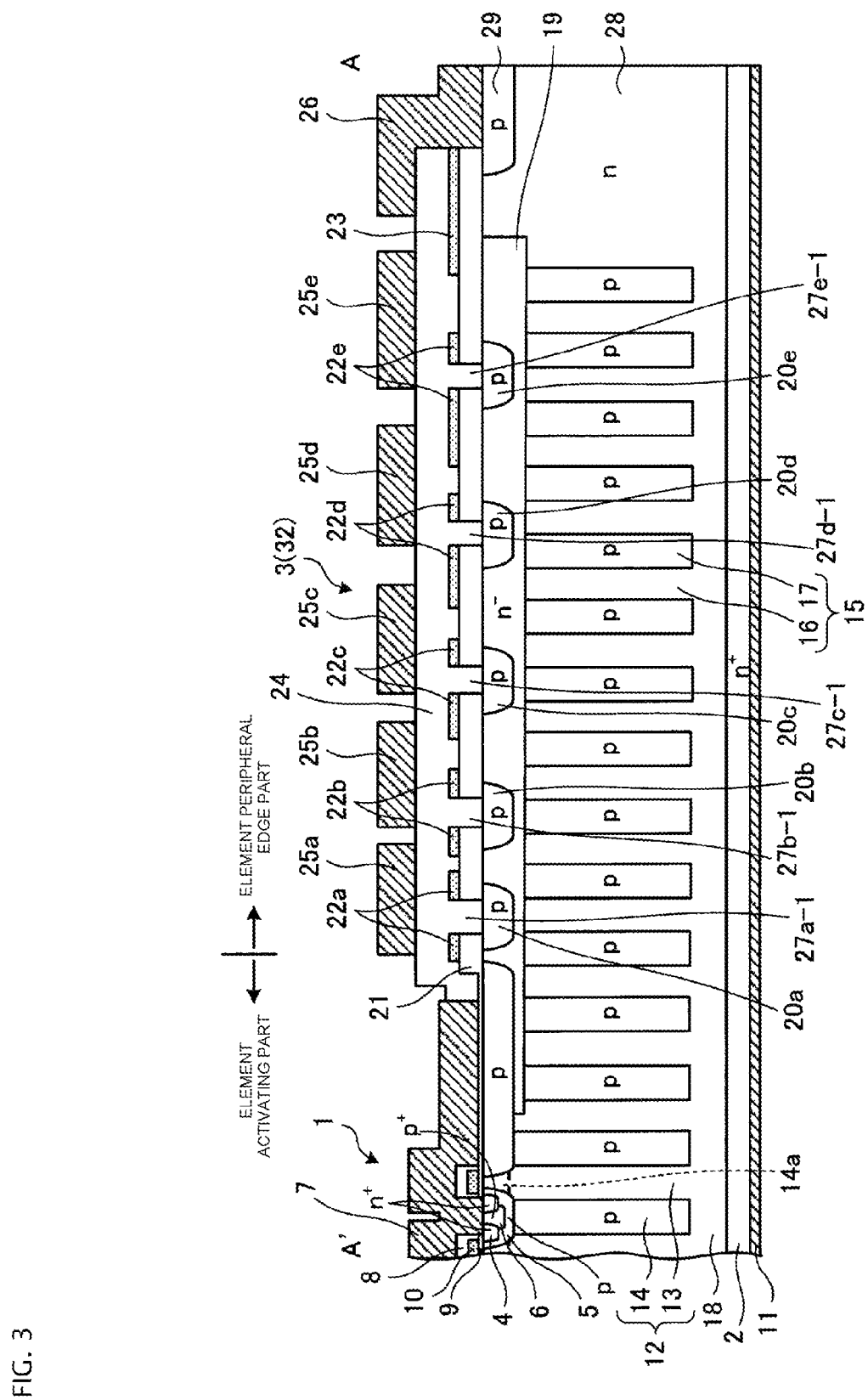
FIG. 3 is a longitudinal cross-sectional view of the semiconductor device according to the first embodiment, which is taken along line A-A' illustrated in FIG. 1.
Figure 4:
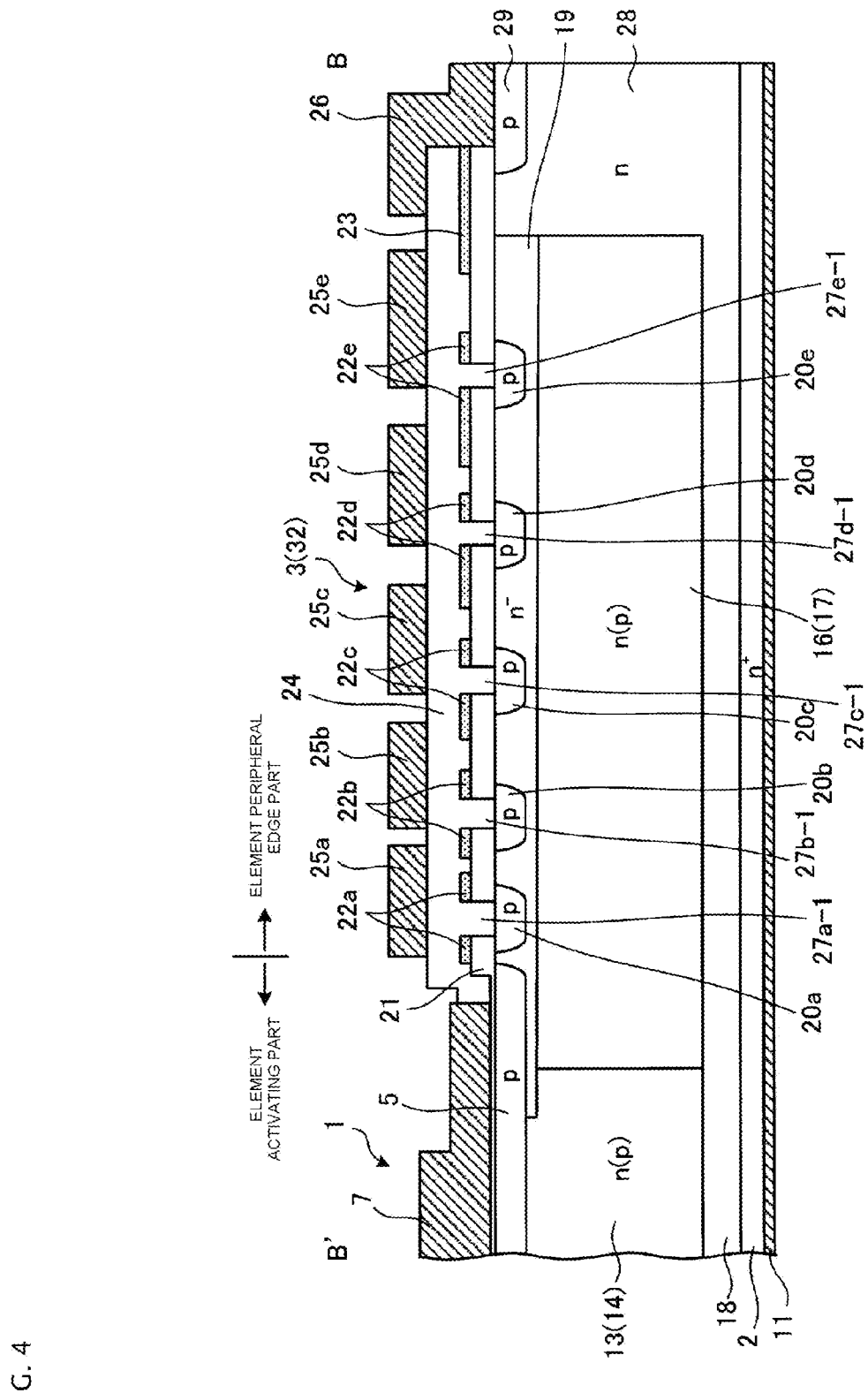
FIG. 4 is a longitudinal cross-sectional view of the semiconductor device according to the first embodiment, which is taken along line B-B' illustrated in FIG. 1.
Figure 5:
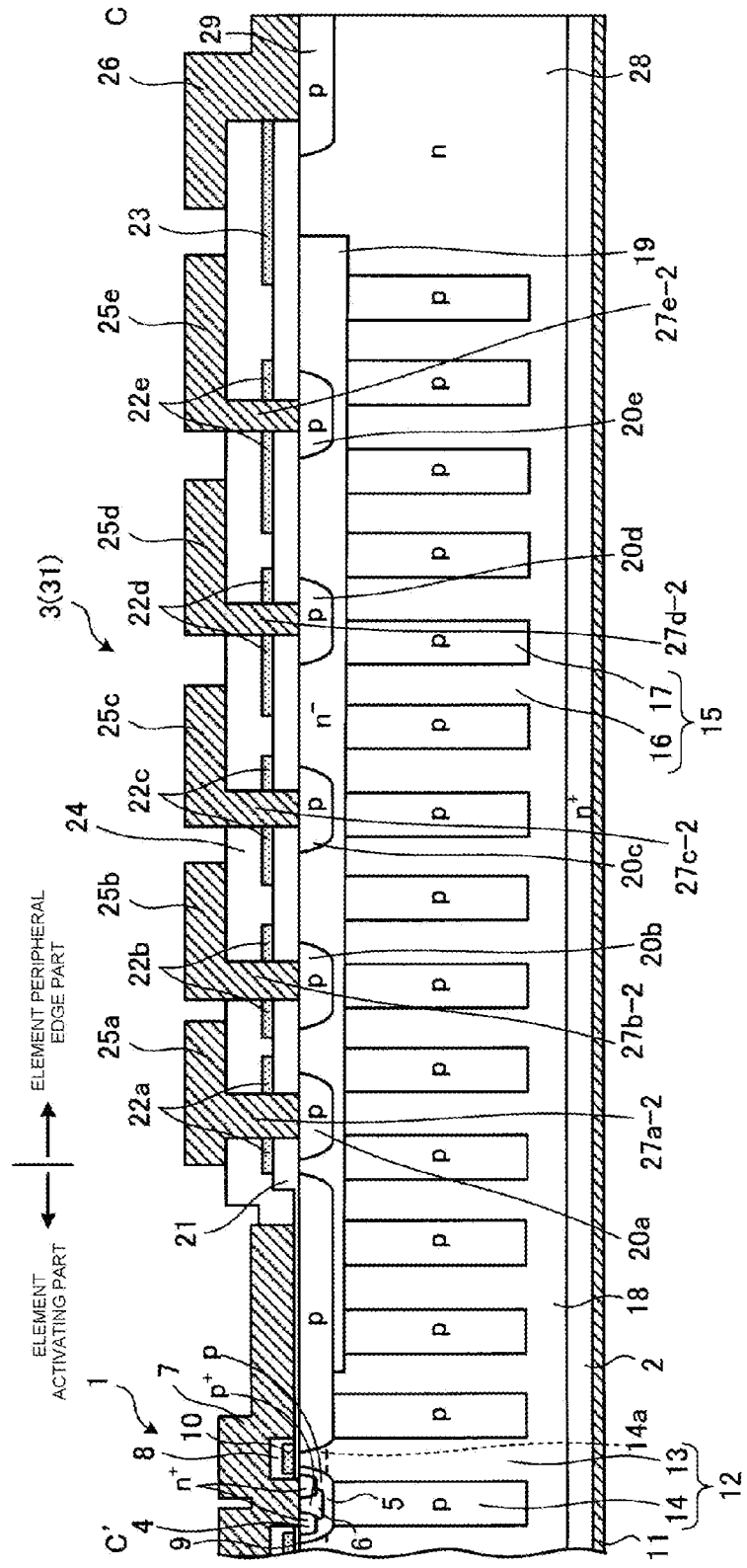
FIG. 5 is a longitudinal cross-sectional view of the semiconductor device according to the first embodiment, which is taken along line C-C' illustrated in FIG. 1.
Figure 6:
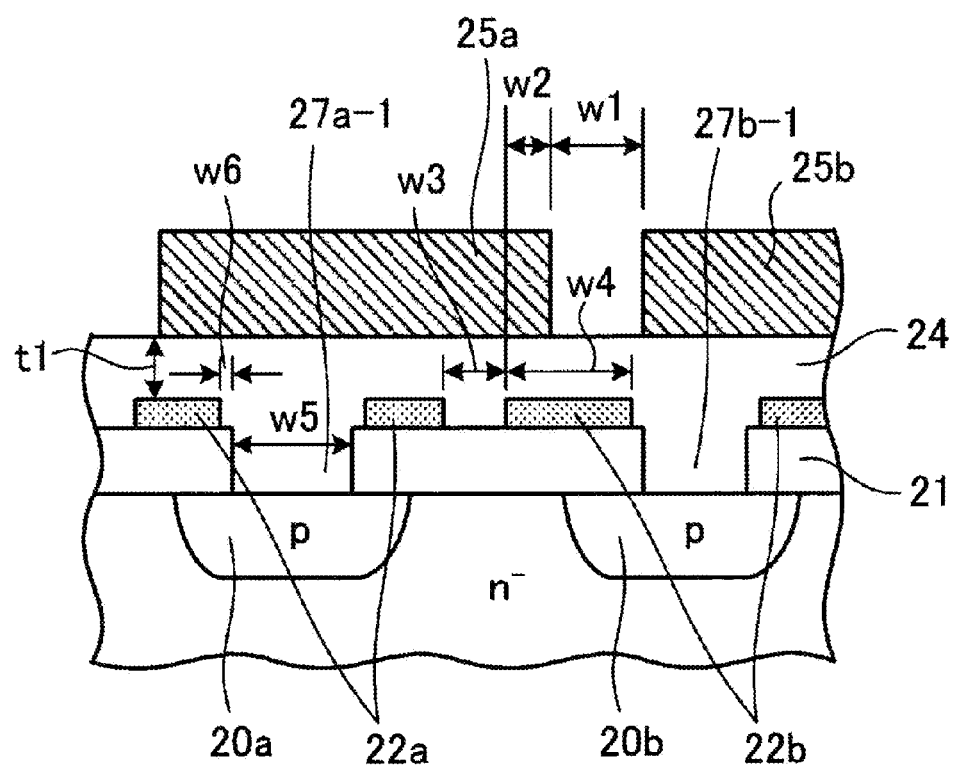
FIG. 6 is a partial enlarged cross-sectional view that illustrates the configuration of an element peripheral edge part of the semiconductor device according to the first embodiment in detail.

FIG. 1 is a plan view of a semiconductor device according to a first embodiment. FIG. 2 is a transverse cross-sectional view of the semiconductor device according to the first embodiment. FIG. 3 is a longitudinal cross-sectional view of the semiconductor device according to the first embodiment, which is taken along line A-A' illustrated in FIG. 1. FIG. 4 is a longitudinal cross-sectional view of the semiconductor device according to the first embodiment, which is taken along line B-B' illustrated in FIG. 1. FIG. 5 is a longitudinal cross-sectional view of the semiconductor device according to the first embodiment, which is taken along line C-C' illustrated in FIG. 1. In FIGS. 1 and 2, a ¼ part of the semiconductor device is illustrated (the same in FIGS. 8, 11, 15, and 18). FIG. 6 is a partial enlarged cross-sectional view that illustrates the configuration of an element peripheral edge part of the semiconductor device according to the first embodiment in detail.

Figure 11:
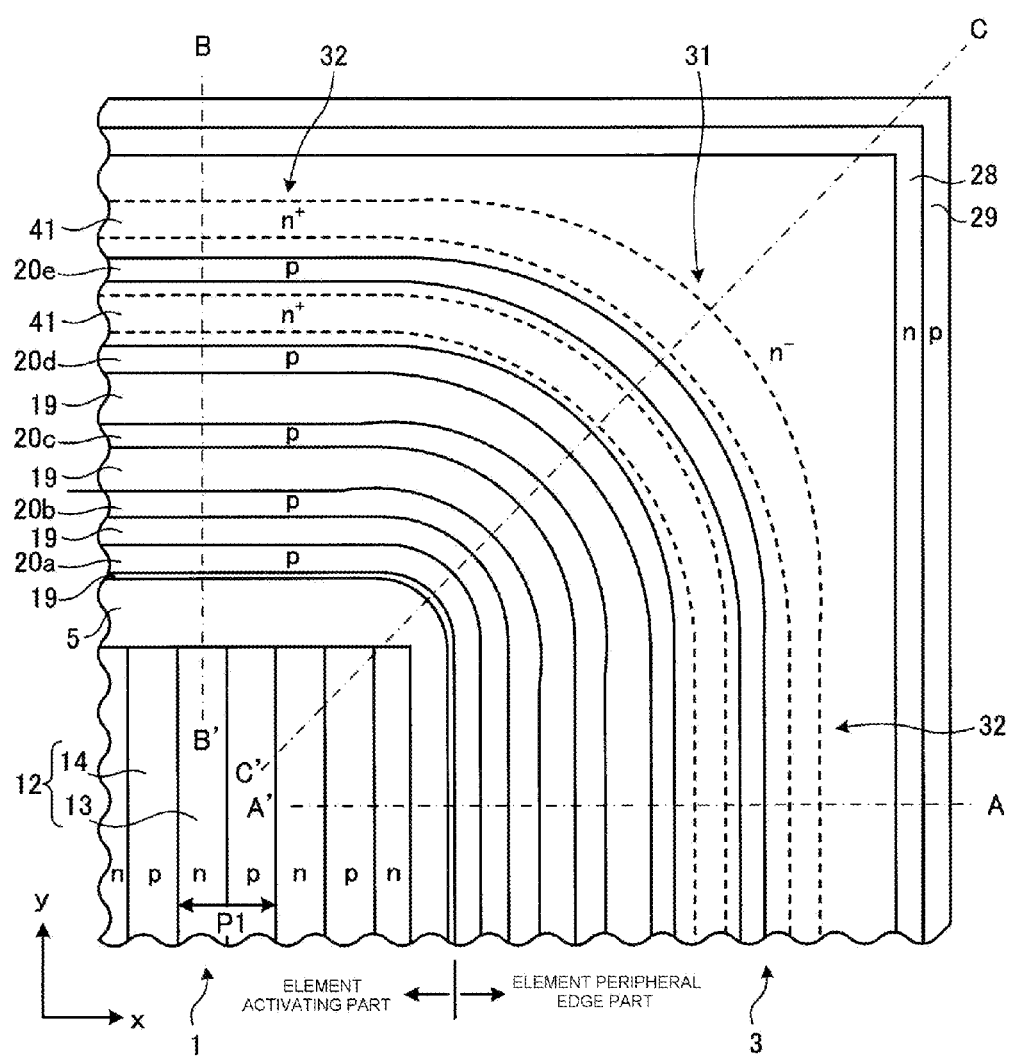
FIG. 11 is a plan view of a semiconductor device according to a third embodiment.
Figure 18:
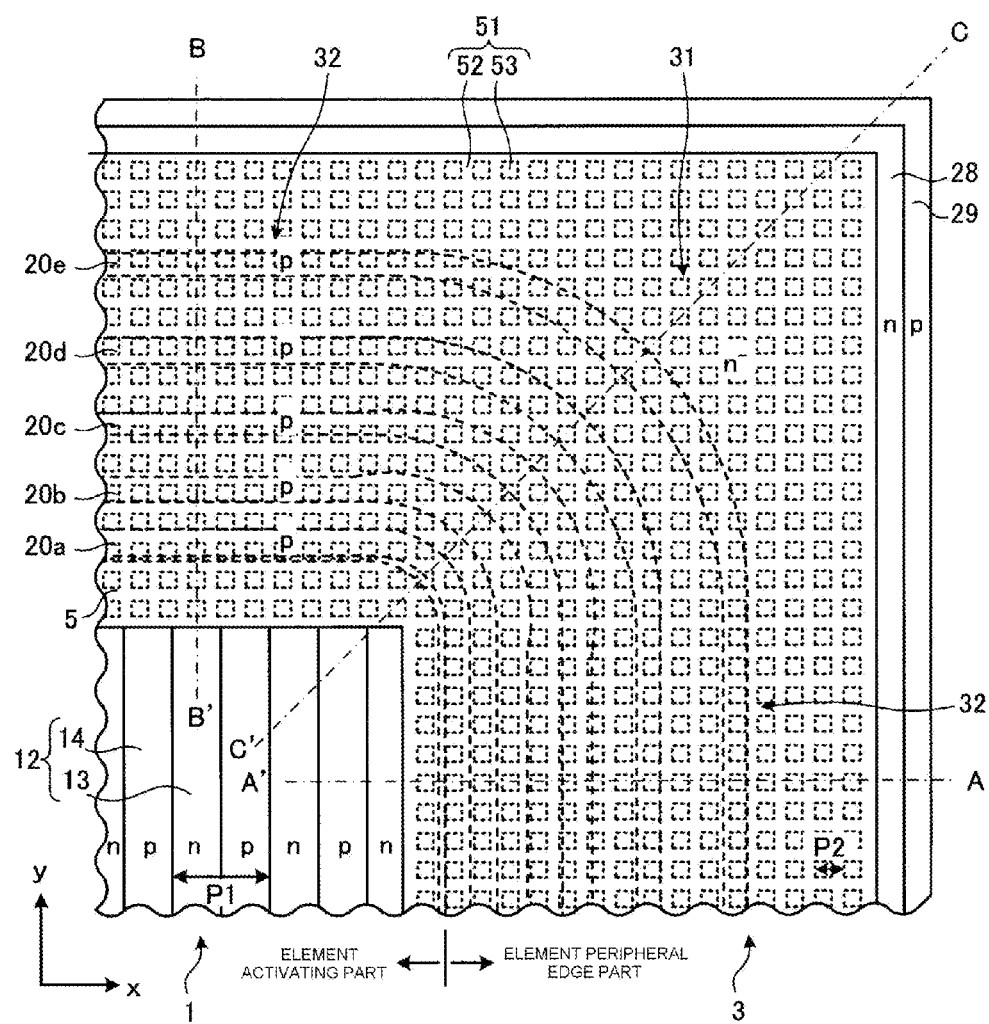
FIG. 18 is a plan view of a semiconductor device according to a fifth embodiment.

In FIG. 1, the shapes of a parallel p-n layer, a p-base area that is located on the outermost side, a p-type guard ring area, and an n-type channel stopper area on a first principal face are illustrated (the same in FIGS. 11 and 18). In FIG. 2, the shapes of an element activating part and an element peripheral edge part on a cross-section that traverses the parallel p-n layer, for example, on a cross-section of the element activating part at a depth of ½ of the parallel p-n layer is illustrated (the same applies to FIGS. 8 and 15). In addition, in FIG. 2, in order to clearly represent the element activating part and the element peripheral edge part, the p-base area of the element activating part that is disposed on the outermost side is denoted by dotted lines.

As illustrated in FIGS. 1 to 5, the semiconductor device has element activating part 1 on the first principal face side and has $n^+$ drain area (low-resistance layer) 2 on a second principal face side. On the outer side of element activating part 1, element peripheral edge part 3 that surrounds element activating part 1 is disposed. On the first principal face side of element activating part 1, as the surface structure of the element, $n^+$ source area 4, p-base area 5, $p^+$ contact area 6, source electrode 7, interlayer insulating film 8, gate insulating film 9, and gate electrode 10 are disposed. On the second principal face, drain electrode 11 is disposed.

First parallel p-n layer 12 is disposed between element activating part 1 and $n^+$ drain area 2. In first parallel p-n layer 12, first n-type areas (first first-conductivity type areas) 13 and first p-type areas (first second-conductivity type areas) 14 are bonded so as to be alternately repeated. The planar shape of first n-type area 13 and first p-type area 14 is a stripe. First n-type area 13 has a uniform impurity density distribution from the first principal face toward the second principal face. First p-type area 14 has an impurity density distribution that decreases from the first principal face toward the second principal face. Accordingly, first p-type area 14 has an impurity density that is higher than first n-type area 13 on the first principal face side and is lower than first n-type area 13 on the second principal face side.

In element peripheral edge part 3, second parallel p-n layer 15 is disposed. In second parallel p-n layer 15, second n-type areas (second first-conductivity type areas) 16 and second p-type areas (second second-conductivity type areas) 17 are bonded so as to be alternately repeated. The planar shape of second n-type area 16 and second p-type area 17 is a stripe.

The direction of the stripe of the second parallel p-n layer 15 is the same as the direction of the stripe of first parallel p-n layer 12. A repetition pitch P2 of second n-type area 16 and second p-type area 17 is the same as a repetition pitch P1 of first n-type area 13 and first p-type area 14. The impurity density and the impurity density distribution of second n-type area 16 are the same as those of first n-type area 13. The impurity density and the impurity density distribution of second p-type area 17 are the same as those of first p-type area 14.

N buffer layer 18 is disposed between first parallel p-n layer 12 and n$^+$ drain area 2. The impurity density of n buffer layer 18 is lower than that of first n-type area 13. N$^-$ surface area (third first-conductivity type area) 19 is disposed between second parallel p-n layer 15 and the first principal face. N$^-$ surface area 19 surrounds first parallel p-n layer 12. The impurity density of n$^-$ surface area 19 is lower than that of first n-type area 13. N$^-$ surface area 19 grows up to a portion of element activating part 1 that is adjacent to element peripheral edge part 3.

On the first principal face side of n$^-$ surface area 19, two or more p-type guard ring areas (third second-conductivity type areas) are disposed so as to be separate from each other. Hereinafter, a case will be described as an example in which, for example, five p-type guard ring areas 20a, 20b, 20c, 20d, and 20e are disposed. The impurity density of p-type guard ring areas 20a, 20b, 20c, 20d, and 20e is higher than that of n$^-$ surface area 19. For example, spaces between p-type guard ring areas 20a, 20b, 20c, 20d, and 20e which are adjacent to each other further increase toward the terminal of element peripheral edge part 3. The reason for this is that the electric field further decreases from the outer circumference of element activating part 1 toward the outer circumference of element peripheral edge part 3.

In addition, the widths of p-type guard ring areas 20a, 20b, 20c, 20d, and 20e in corner portion 31 of element peripheral edge part 3 are larger than the widths of p-type guard ring areas 20a, 20b, 20c, 20d, and 20e in line-shaped portion (hereinafter, referred to as a linear portion) 32 other than corner portion 31 of element peripheral edge part 3. The reason for this is that a contact with the field plate electrode, which will be described later, can be formed while an increase in the widths of p-type guard ring areas 20a, 20b, 20c, 20d, and 20e in linear portion 32 of element peripheral edge part 3 is suppressed, and accordingly, the ratio of element peripheral edge part 3 to the whole element can be suppressed. The width of the p-type guard ring area is a width in a direction in which first n-type areas 13 and first p-type areas 14 are repeatedly bonded (the same applies to the widths w2 and w4 to w6 to be described later).

N$^-$ surface area 19 is covered with first insulating film 21. First insulating film 21 may be, for example, an oxide film. On first insulating film 21 (a face located on a side opposite to a face located on n$^-$ surface area 19 side of first insulating film 21), two or more first field plate electrodes (first conductive layer) 22a, 22b, 22c, 22d, and 22e are disposed so as to be separate from each other. First field plate electrodes (first conductive layer) 22a, 22b, 22c, 22d, and 22e partially cover first insulating film 21. In addition, on first insulating film 21, first channel stopper electrode 23 is disposed so as to be separate from first plate electrodes (first conductive layer) 22a, 22b, 22c, 22d, and 22e. First field plate electrodes 22a, 22b, 22c, 22d, and 22e and first channel stopper electrode 23 can be formed, for example, from polysilicon (poly-Si) and may be formed simultaneously with gate electrode 10 of element activating part 1.

First insulating film 21, for example, is used for a mask for ion injection and heat treatment according to self-alignment at the time of forming p-type guard ring areas 20a, 20b, 20c, 20d, and 20e. Accordingly, in first insulating film 21, opening portions 27a-1, 27b-1, 27c-1, 27d-1, and 27e-1 are disposed, which are used for forming p-type guard ring areas 20a, 20b, 20c, 20d, and 20e. For example, through an etching process performed at the time of forming opening portions 27a-1, 27b-1, 27c-1, 27d-1, and 27e-1 in first insulating film 21, first field plate electrodes 22a, 22b, 22c, 22d, and 22e are divided into the inner peripheral side (the element activating part 1 side) and the outer peripheral side (the terminal side of element peripheral edge part 3) with opening portions 27a-1, 27b-1, 27c-1, 27d-1, and 27e-1 interposed therebetween on first insulating film 21.

First field plate electrodes 22a, 22b, 22c, 22d, and 22e and first channel stopper electrode 23 are covered with second insulating film (insulating layer) 24. In addition, second insulating film 24 is buried inside opening portions 27a-1, 27b-1, 27c-1, 27d-1, and 27e-1 of first insulating film 21. For example, first insulating film 24 is a boro-phospho silicate glass (BPSG) film. On second insulating film 24 (a face of second insulating film 24 that is located on a side opposite to the face located on n$^-$ surface area 19 side), two or more second field plate electrodes 25a, 25b, 25c, 25d, and 25e (second conductive layer) are disposed so as to separate from each other. In addition, on second insulating film 24, second channel stopper electrode 26 is disposed so as to be separate from second field plate electrodes 25a, 25b, 25c, 25d, and 25e.

Second field plate electrodes 25a, 25b, 25c, 25d, and 25e are electrically connected to p-type guard ring areas 20a, 20b, 20c, 20d, and 20e in corner portion 31 of element peripheral edge part 3. More specifically, in corner portion 31 of element peripheral edge part 3, contact portions 27a-2, 27b-2, 27c-2, 27d-2, and 27e-2 are disposed, which pass through second insulating film 24 buried inside opening portions 27a-1, 27b-1, 27c-1, 27d-1, and 27e-1 of first insulating film 21 and reach p-type guard ring areas 20a, 20b, 20c, 20d, and 20e. In addition, second field plate electrodes 25a, 25b, 25c, 25d, and 25e are connected to p-type guard ring areas 20a, 20b, 20c, 20d, and 20e through contact portions 27a-2, 27b-2, 27c-2, 27d-2, and 27e-2, respectively. Furthermore, second field plate electrodes 25a, 25b, 25c, 25d, and 25e are connected to first field plate electrodes 22a, 22b, 22c, 22d, and 22e through contact portions 27a-2, 27b-2, 27c-2, 27d-2, and 27e-2.

Second field plate electrode 25a that is located on the innermost side overhangs a bonding portion of p-type guard ring area 20a that is electrically connected thereto and n$^-$ surface area 19 on the first principal face in the inner circumferential direction. In addition, second field plate electrodes 25a, 25b, 25c, 25d, and 25e are disposed over p-type guard ring areas 20a, 20b, 20c, 20d, and 20e, which are electrically connected thereto, and n$^-$ surface area 19. More specifically, second field plate electrodes 25a, 25b, 25c, 25d, and 25e overhang a bonding portion of p-type guard ring areas 20a, 20b, 20c, 20d, and 20e, which are electrically connected thereto, and n$^-$ surface area 19 on the first principal face in the outer circumferential direction. Second field plate electrodes 25a, 25b, 25c, and 25d other than second field plate electrode 25e that is located on the outermost side cover first field plate electrodes 22b, 22c, 22d, and 22e that are adjacent to each other in the outer circumferential direction so as to cover the first principal faces between first field plate electrodes 22b, 22c, 22d, and 22e through second insulating film 24. In addition, second field plate electrode 25e located on the outermost side covers first channel stopper electrode 23 so as to cover the first principal face between first field plate electrode 22e and first channel stopper electrode 23 through second insulating film 24. In other words, second field plate electrodes 25a, 25b, 25c, 25d, and 25e partially overlap first field plate electrodes 22b, 22c, 22d, and 22e and first channel stopper electrode 23 that are adjacent to each other in the outer circumferential direction through second insulating film 24.

As above, in portions located on the first principal face side of element peripheral edge part 3 in which second field plate electrodes 25a, 25b, 25c, 25d, and 25e are not arranged, first field plate electrodes 22a, 22b, 22c, 22d, and 22e are arranged. Accordingly, the whole first principal face of element peripheral edge part 3 is completely covered with first field plate electrodes 22a, 22b, 22c, 22d, and 22e and second field plate electrodes 25a, 25b, 25c, 25d, and 25e. Since the effect of electric charge (ions) can be blocked by first field plate electrodes 22a, 22b, 22c, 22d, and 22e and second field plate electrodes 25a, 25b, 25c, 25d, and 25e, the electric charge resistance of the breakdown voltage is markedly improved.

Each space w1 between second field plate electrodes 25a, 25b, 25c, and 25d that are adjacent to each other is larger than the spaces w2 of portions of first field plate electrodes 22b, 22c, 22d, and 22e, which are adjacent to each other on the outer circumferential side, covered with second field plate electrodes 25a, 25b, 25c, and 25d. A space between second field plate electrode 25e and second channel stopper electrode 26 is larger than the width of a portion at which second field plate electrode 25e and first channel stopper electrode 23 overlap with each other. The reason for this is that an increase in the electric field can be alleviated by overlapping second field plate electrodes 25a, 25b, 25c, and 25d and first field plate electrodes 22b, 22c, 22d, and 22e that are adjacent to each other in the outer circumferential direction with each other and overlapping second field plate electrode 25e and first channel stopper electrode 23 with each other.

Each space w3 between the first field plate electrodes 22a, 22b, 22c, 22d, and 22e that are adjacent to each other is the thickness t1 of second insulating film 24 that is interposed between first field plate electrode 22a and second field plate electrode 25a or more. The reason for this is that the occurrence of insulation breakdown due to voltages applied between p-type guard ring areas 20a, 20b, 20c, 20d, and 20e, which are adjacent to each other, can be avoided. Out of first field plate electrodes 22a, 22b, 22c, 22d, and 22e that are located so as to have opening portions 27a-1, 27b-1, 27c-1, 27d-1, and 27e-1 of first insulating film 21 interposed therebetween, the width w4 of each one of first field plate electrodes 22a, 22b, 22c, 22d, and 22e that are located on element activating part 1 side of opening portions 27a-1, 27b-1, 27c-1, 27d-1, and 27e-1 of first insulating film 21 further increases toward the terminal of element peripheral edge part 3. The reason for this is that an electric field distribution that further decreases from a position near the outer circumference of element activating part 1 toward the terminal of element peripheral edge part 3 can be made uniform for the whole element peripheral edge part 3.

In a terminal area of element peripheral edge part 3, n-type channel stopper area 28 is provided. On the first principal face side of n-type channel stopper area 28, p-type outermost circumferential area 29 is provided. Second channel stopper electrode 26 is electrically connected to p-type outermost circumferential area 29. In addition, second channel stopper electrode 26 is connected to first channel stopper electrode 23. The number of p-type guard ring areas is set such that the electric field concentrations between p-type guard ring areas 20a, 20b, 20c, 20d, and 20e that are adjacent to each other are approximately the same, and electric potential differences between p-type guard ring areas 20a, 20b, 20c, 20d, and 20e that are adjacent to each other are maintained to be an insulation breakdown voltage or less. In addition, the number of p-type guard ring areas, for example, is determined by the thickness t1 of second insulating film 24 that is interposed between first field plate electrode 22a and second field plate electrode 25a in which the electric field is concentrated most.

More specifically, for example, it is preferable that the number of p-type guard ring areas be five in a case where the breakdown voltage is in a 600 V class and be twelve in a case where the breakdown voltage is in a 1,200 V class. For example, in a case where the breakdown voltage is in the 600 V class, by arranging five p-type guard ring areas, second insulating film 24 interposed between first field plate electrode 22a and second field plate electrode 25a can be formed thin so as to have a thickness t1 of about 1.1 µm, and electric potential differences between p-type guard ring areas 20a, 20b, 20c, 20d, and 20e that are adjacent to each other can be set, for example, to be 200 V or less for which insulation breakdown does not occur. In addition, since second insulating film 24 that is interposed between first field plate electrode 22a and second field plate electrode 25a can be formed to have a small thickness t1, the cost can be reduced.

Although not particularly limited, for example, in a case where the semiconductor device according to the first embodiment is the vertical type MOSFET, and the breakdown voltage is in the 600 V class, the dimension and the impurity density of each part have the following values. The thickness (the thickness of first parallel p-n layer 12) of the drift area is 36.0 µm, the width of each one of first n-type area 13 and second n-type area 16 is 6.0 µm, and the impurity density of each one of first n-type area 13 and second n-type area 16 is $3.0 \times 10^{15}$ cm$^{-3}$. The width of each one of first p-type area 14 and second p-type area 17 is 6.0 µm. The repetition pitch P1 of first parallel p-n layer 12 is 12.0 µm, and the repetition pitch P2 of second parallel p-n layer 15 is 12.0 µm.

The impurity density of first p-type area 14 is $2.46 \times 10^{15}$ cm$^{-3}$, $2.82 \times 10^{15}$ cm$^{-3}$, $3.18 \times 10^{15}$ cm$^{-3}$, $3.54 \times 10^{15}$ cm$^{-3}$, and $3.9 \times 10^{15}$ cm$^{-3}$ from the second principal face side toward the first principal face side in a stepped manner. The impurity density of second p-type area 17 is $2.46 \times 10^{15}$ cm$^{-3}$, $2.82 \times 10^{15}$ cm$^{-3}$, $3.18 \times 10^{15}$ cm$^{-3}$, and $3.54 \times 10^{15}$ cm$^{-3}$ from the second principal face side toward the first principal face side in a stepped manner. In such a case, in element activating part 1, for example, first p-type area 14 is arranged in which five epitaxial layers of which the impurity densities increase from the lower layer side sequentially from the second principal face toward the first principal face. In the fifth epitaxial layer (the first principal face side) that forms first p-type area 14, an element structure is formed. In element peripheral edge part 3, second p-type area 17 is arranged in which four epitaxial layers of which impurity densities increases from the lower layer side sequentially from the second principal face toward the first principal faces are stacked. The fifth epitaxial layer that is stacked on the first principal face side of second p-type area 17 forms n$^-$ surface area 19. The impurity density of n$^-$ surface area 19 is $2 \times 10^{14}$ cm$^{-3}$ or more and $8 \times 10^{14}$ cm$^{-3}$ or less and is preferably $5.0 \times 10^{14}$ cm$^{-3}$. The depth of n$^-$ surface area 19 is 5 µm. The diffusion depth of each one of p-type guard ring areas 20a, 20b, 20c, 20d, and 20e is 3.0 µm, and the surface impurity density of each one of p-type guard ring areas 20a, 20b, 20c, 20d, and 20e is $1.8 \times 10^{17}$ cm$^{-3}$. In addition, the diffusion depth of the p well area (p-base area 5) is 3.0 µm, and the surface impurity density of the p well area is $1.8 \times 10^{17}$ cm$^{-3}$.

The diffusion depth of the n$^+$ source area 4 is 0.5 µm, and the surface impurity density of the n$^+$ source area 4 is $3.0 \times 10^{20}$ cm$^{-3}$. The diffusion depth of the n-type drift area 14a (an n-type area that is located on a further source electrode 7 side than a broken line represented between p-base areas 5 in FIGS. 3 to 5) located on the surface is 2.5 μm, and the surface impurity density of n-type drift area 14*a* located on the surface is $2.0 \times 10^{16}$ cm$^{-3}$. The thickness of n buffer layer 18 is 5 μm, and the impurity density of n buffer layer 18 is $1.0 \times 10^{15}$ cm$^{-3}$. The thickness of n$^+$ drain area 2 is 300 μm, and the impurity density of n$^+$ drain area 2 is $2.0 \times 10^{18}$ cm$^{-3}$. The impurity density of n-type channel stopper area 28 is $4.0 \times 10^{15}$ cm$^{-3}$. The impurity density of p-type outermost circumferential area 29 is $1.8 \times 10^{17}$ cm$^{-3}$.

A space w1 between second field plate electrodes 25*a*, 25*b*, 25*c*, 25*d*, and 25*e* that are adjacent to each other is 3 μm. A width w2 in which second field plate electrodes 25*a*, 25*b*, 25*c*, and 25*d* and first field plate electrodes 22*b*, 22*c*, 22*d*, and 22*e* adjacent thereto on the outer side and second field plate electrode 25*e* and first channel stopper electrode 23 overlap each other is 2 μm. A width w5 of the opening portion that is used for forming p-type guard ring areas 20*a*, 20*b*, 20*c*, 20*d*, and 20*e* disposed on first insulating film 21 is 4 μm.

First field plate electrodes 22*a*, 22*b*, 22*c*, 22*d*, and 22*e* are selectively removed when opening portions used for forming p-type guard ring areas 20*a*, 20*b*, 20*c*, 20*d*, and 20*e* in first insulating film 21 and are divided with the opening portions interposed therebetween. A width w6 between the end portion of the opening portion of first insulating film 21 and the end portions of first field plate electrodes 22*a*, 22*b*, 22*c*, 22*d*, 22*e* on the opening portion side is 1 μm.

Figure 7:
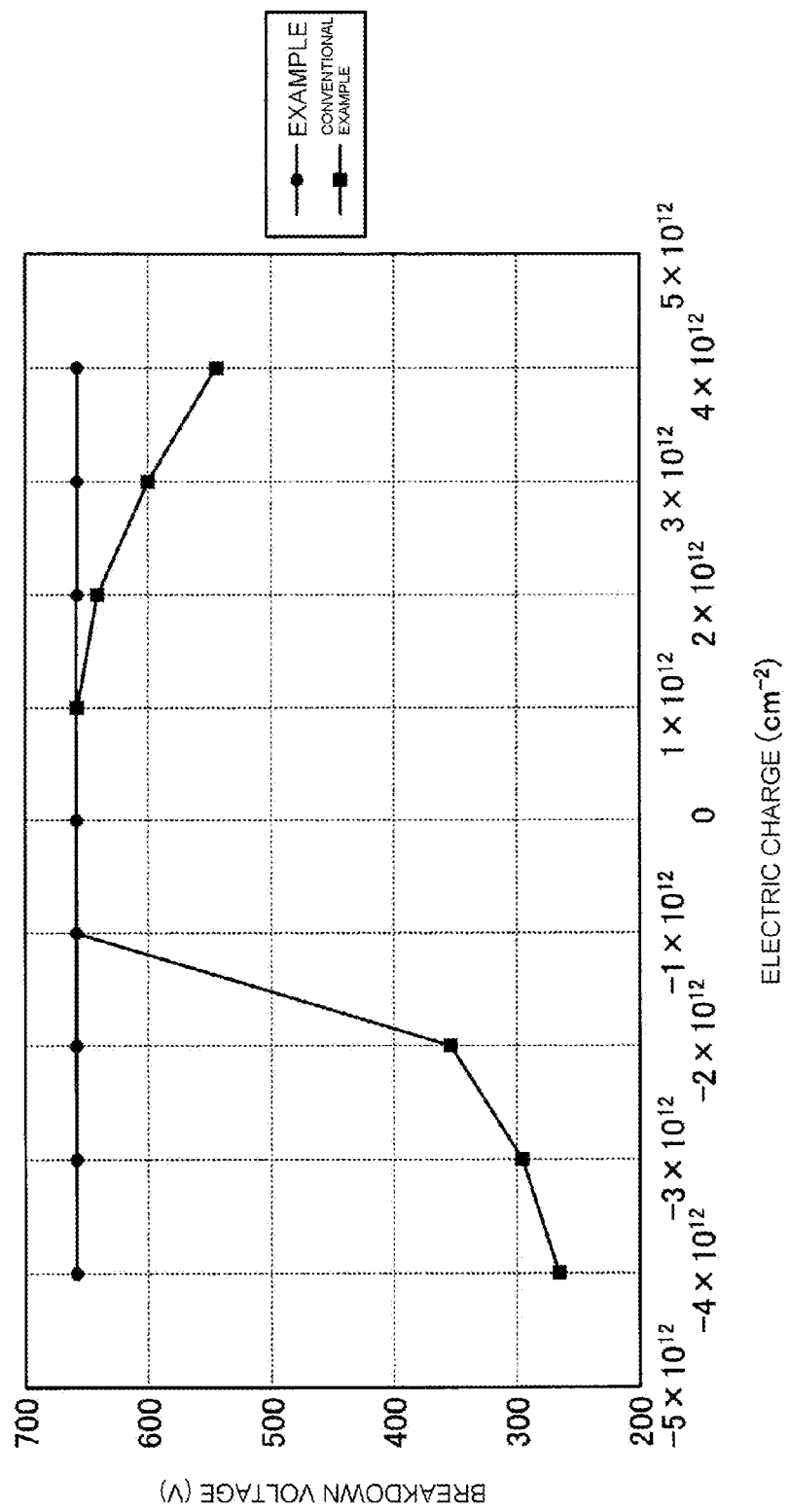
FIG. 7 is a characteristic diagram that illustrates a result of simulating the dependency of the breakdown voltage on the surface electric charge in the semiconductor device according to the first embodiment.
Figure 23:
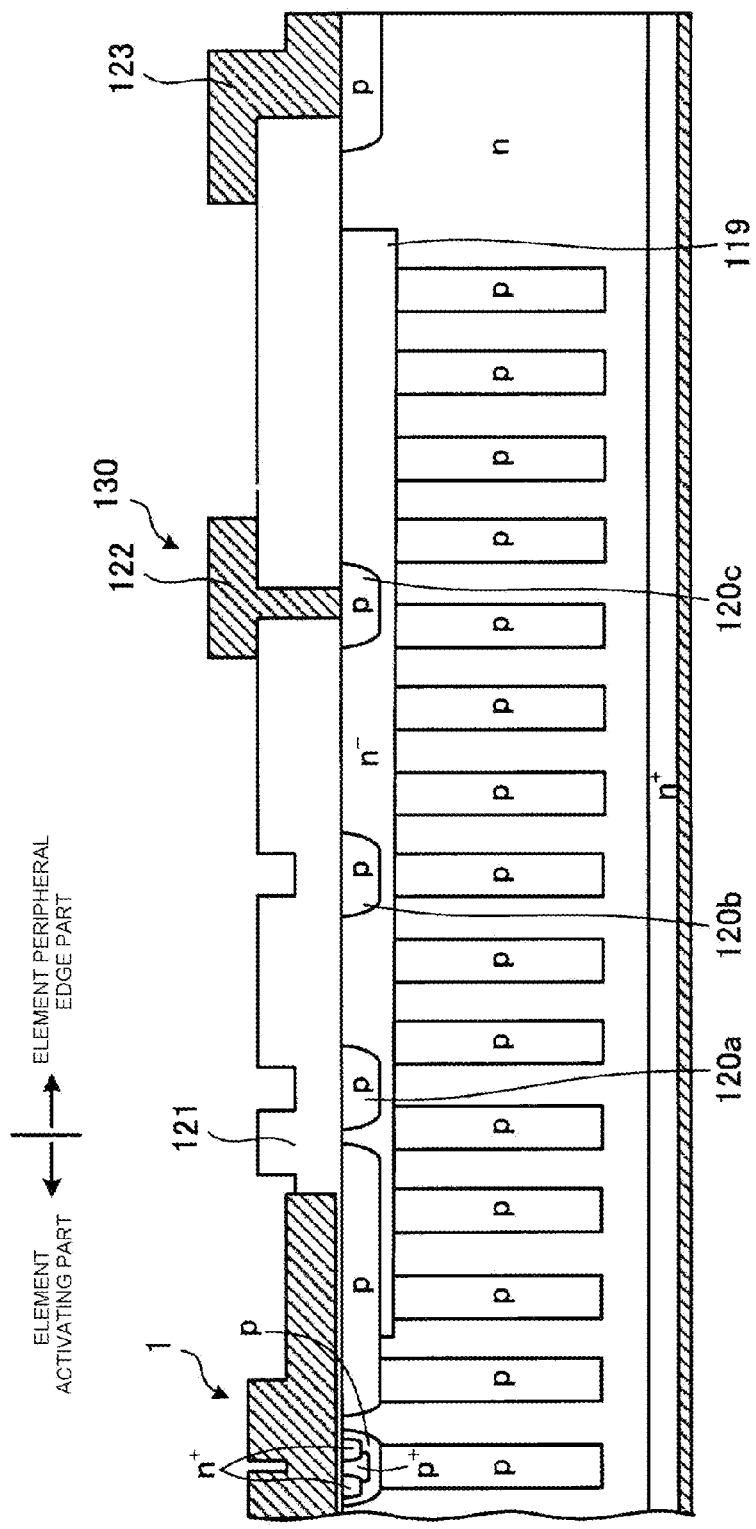
FIG. 23 is a cross-sectional view that illustrates the configuration of a conventional semiconductor device.

FIG. 7 is a characteristic diagram that illustrates a result of simulating the dependency of the breakdown voltage on the surface electric charge in the semiconductor device according to the first embodiment. This example of the simulation result is a simulation result of a semiconductor device, which is manufactured according to the first embodiment, having a configuration in which five p-type guard ring areas 20*a*, 20*b*, 20*c*, 20*d*, and 20*e* are electrically connected to first field plate electrodes 22*a*, 22*b*, 22*c*, 22*d*, and 22*e* and second field plate electrodes 25*a*, 25*b*, 25*c*, 25*d*, and 25*e*. In addition, a conventional example of the simulation result is, as illustrated in FIG. 23, a configuration in which three p-type guard ring areas are arranged, and a field plate electrode is electrically connected to the p-type guard ring area located on the outermost side.

As illustrated in FIG. 7, in the example, even in a case where there is positive electric charge (positive ions) of $+1.0 \times 10^{12}$ cm$^{-2}$ or more or there is negative electric charge (negative ions) of $-1.0 \times 10^{12}$ cm$^{-2}$ or less on first insulating film 21 between the field plate electrode and the channel stopper electrode, the breakdown voltage hardly changes. On the other hand, in the conventional example, in a case where there is positive electric charge of $+1.0 \times 10^{12}$ cm$^{-2}$ or more on first insulating film 21 between the field plate electrode and the channel stopper electrode and a case where there is negative electric charge of $-1.0 \times 10^{12}$ cm$^{-2}$ or less, the breakdown voltage changes. In other words, it can be understood that the semiconductor device according to the first embodiment has a breakdown voltage that is higher than that of the conventional example and has improved electric charge resistance of the breakdown voltage.

According to the first embodiment, electric charges or ions arriving at element peripheral edge part 3 are collected by first field plate electrodes 22*a*, 22*b*, 22*c*, 22*d*, and 22*e* and second field plate electrodes 25*a*, 25*b*, 25*c*, 25*d*, and 25*e*. Accordingly, even in a case where there is positive electric charge between the field plate electrode and the channel stopper electrode, an electric field is not concentrated on the end portions of first field plate electrodes 22*a*, 22*b*, 22*c*, 22*d*, and 22*e*, and even in a case where there is negative electric charge, an electric field is not concentrated on the end portions of the first and second channel stopper electrodes 23 and 26. Accordingly, the expansion of the depletion layer can be controlled so as to suppress the occurrence of avalanche by alleviating the electric field in element periphery edge part 3, and thus the effect of electric charge (ions) on the breakdown voltage can be decreased, whereby the electric charge resistance can be markedly improved. Therefore, variations in the breakdown voltage due to the electric charge can be suppressed.

More particularly, since the impurity density of p-type guard ring areas 20*a*, 20*b*, 20*c*, 20*d*, and 20*e* is higher than that of n$^-$ surface area 19, when a voltage is applied, a neutral area remains in p-type guard ring areas 20*a*, 20*b*, 20*c*, 20*d*, and 20*e*, whereby the electric potential of p-type guard ring areas 20*a*, 20*b*, 20*c*, 20*d*, and 20*e* is fixed. Accordingly, in a portion in which an end portion of the metal plate in the forward direction that corresponds to a hanging portion of the outer circumferential side of second field plate electrodes 25*a*, 25*b*, 25*c*, 25*d*, and 25*e* and an end portion of the metal plate in the backward direction that is in contact with the inner circumferential side of first field plate electrodes 22*a*, 22*b*, 22*c*, 22*d*, and 22*e* that are adjacent to each other on the outer side overlap with each other, the electric field that is applied to element peripheral edge part 3 is shared. Therefore, in a case where there is electric charge between first field plate electrodes 22*a*, 22*b*, 22*c*, and 22*d* and second field plate electrodes 25*a*, 25*b*, 25*c*, and 25*d* or between second field plate electrode 25*e* and first and second channel stopper electrodes 23 and 26, variations in the surface electric potential can be suppressed, whereby the electric charge resistance of the breakdown voltage is improved.

In addition, as the thickness t1 of second insulating film 24 that is interposed between first field plate electrode 22*a* and second field plate electrode 25*a* decreases, the electric field that is applied to element peripheral edge part 3 increases, and accordingly, in a case where there is a defect in second insulating film 24, there is concern that a defective element may be formed. Therefore, according to the first embodiment, by further increasing the spaces between p-type guard ring areas 20*a*, 20*b*, 20*c*, 20*d*, and 20*e* toward the terminal of element peripheral edge part 3, the electric potentials between adjacent p-type guard ring areas 20*a*, 20*b*, 20*c*, 20*d*, 20*e* are averaged, and the occurrence of an electric potential difference between specific p-type guard ring areas that is larger than that between the other p-type guard ring areas can be prevented. In addition, in a case where the electric potential difference between p-type guard ring areas 20*a*, 20*b*, 20*c*, 20*d*, and 20*e* that are adjacent to each other is made uniform as above, the electric field distribution of element peripheral edge part 3 decreases from a position near the outer circumference of element activating part 1 toward the terminal of element peripheral edge part 3, and accordingly, element peripheral edge part 3 is lengthened, whereby the cost increases. Therefore, according to the first embodiment, by further increasing the width w3 of first field plate electrodes 22*a*, 22*b*, 22*c*, 22*d*, and 22*e* toward the terminal of element peripheral edge part 3, element peripheral edge part 3 is not lengthened, and the electric field distribution that is lowered from a position near the outer circumference of element activating part 1 toward the terminal of element peripheral edge part 3 is relieved, whereby the electric potential differences between adjacent p-type guard ring areas 20*a*, 20*b*, 20*c*, 20*d*, and 20*e* can be made uniform.

Second Embodiment

Figure 8:
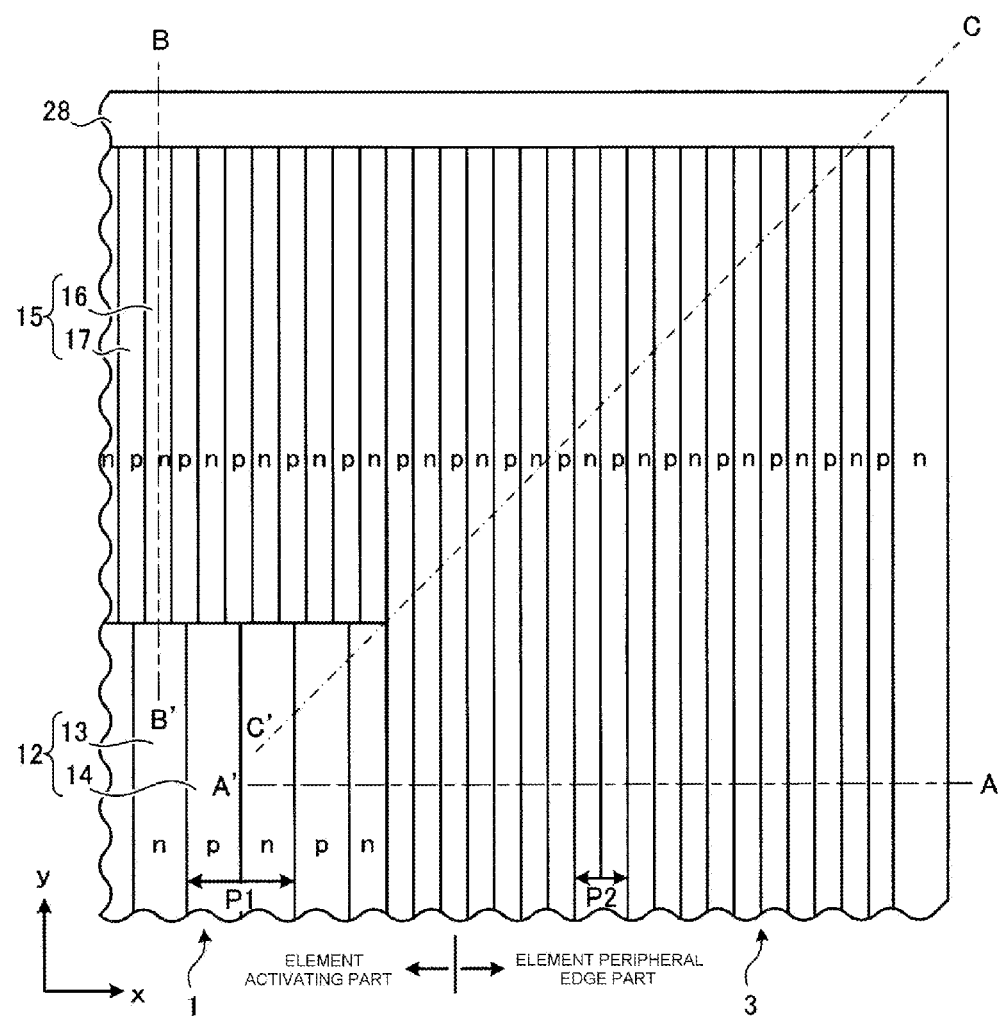
FIG. 8 is a plan view of a semiconductor device according to a second embodiment.
Figure 9:
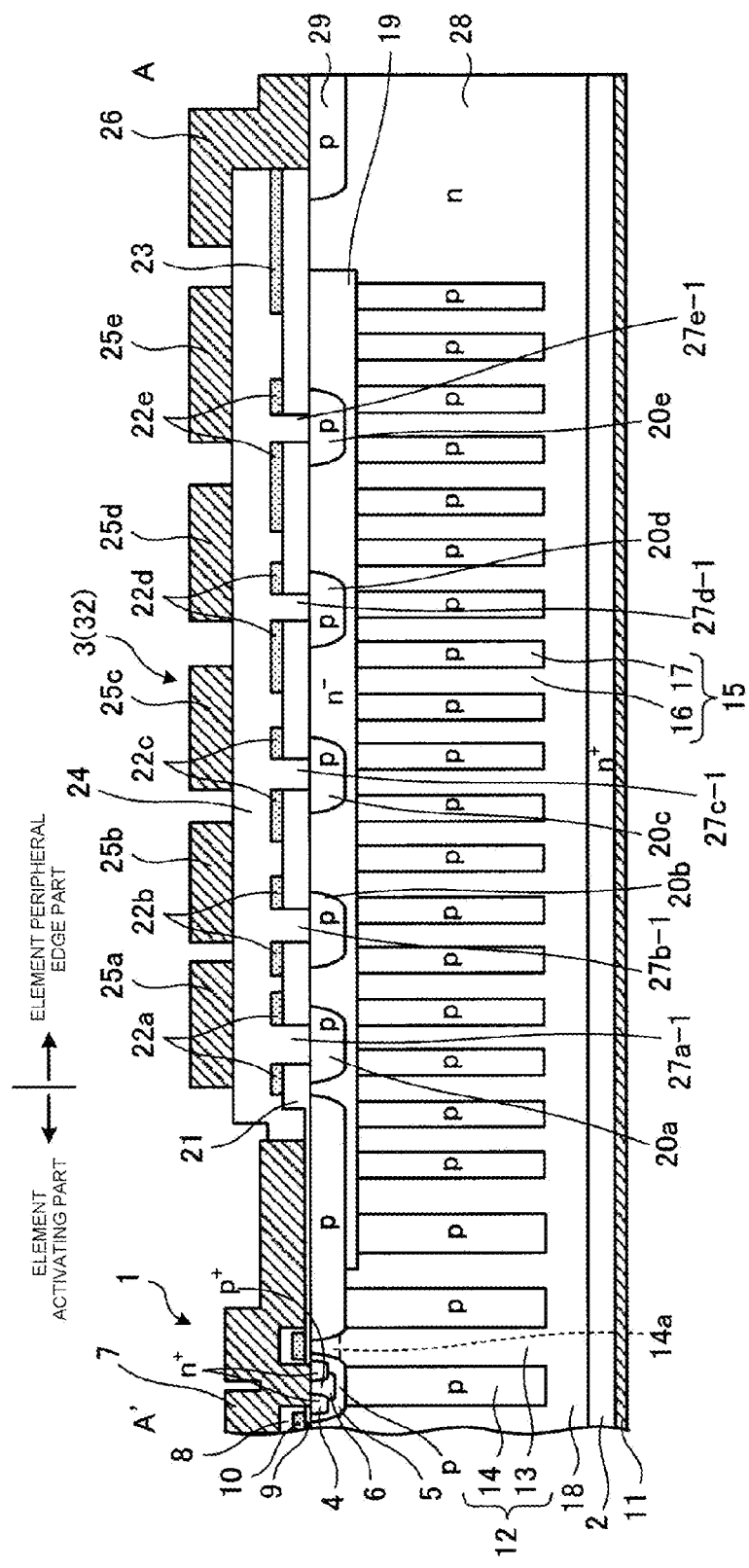
FIG. 9 is a longitudinal cross-sectional view of the semiconductor device according to the second embodiment, which is taken along line A-A' illustrated in FIG. 8.
Figure 10:
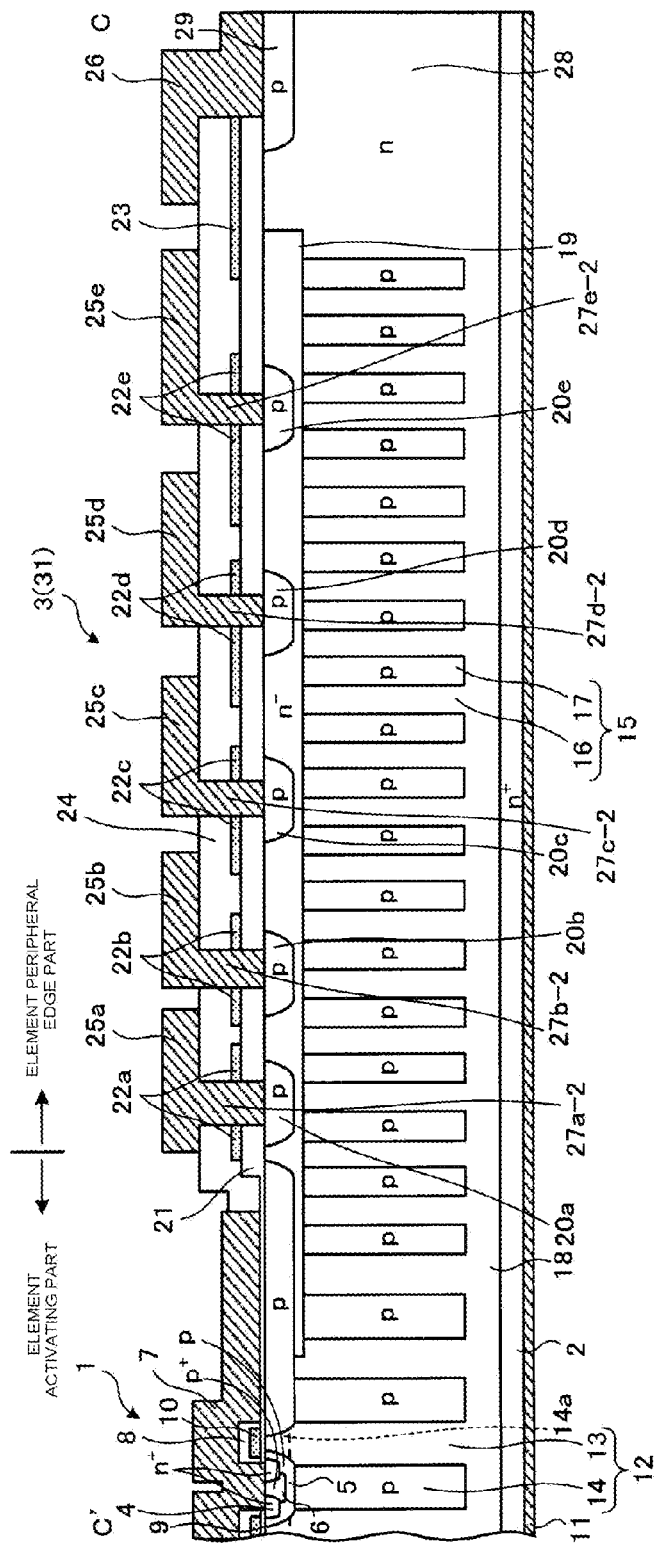
FIG. 10 is a longitudinal cross-sectional view of the semiconductor device according to the second embodiment, which is taken along line C-C' illustrated in FIG. 8.

FIG. 8 is a plan view of a semiconductor device according to a second embodiment. FIG. 9 is a longitudinal cross-sectional view of the semiconductor device according to the second embodiment, which is taken along line A-A' illustrated in FIG. 8. FIG. 10 is a longitudinal cross-sectional view of the semiconductor device according to the second embodiment, which is taken along line C-C' illustrated in FIG. 8. The longitudinal cross-sectional view taken along line B-B' illustrated in FIG. 8 is similar to the longitudinal cross-sectional view illustrated in FIG. 4. As illustrated in FIGS. 8 to 10, a difference between the second embodiment and the first embodiment is that the repetition pitch P2 of second n-type areas 16 and second p-type areas 17 is smaller than the repetition pitch P1 of first n-type areas 13 and first p-type areas 14 in the second embodiment.

It is preferable that the width of each one of second n-type area 16 and second p-type area 17 is ⅔ of the width of each one of first n-type area 13 and first p-type area 14. The reason for this is that the arrangement of first parallel p-n layer 12 and second parallel p-n layer 15 can be easily designed. A turning point of the pitch in the parallel p-n layer, that is, a boundary between first parallel p-n layer 12 and second parallel p-n layer 15 is located under the n⁻ surface area 19. Second n-type area 16 has a distribution of the impurity density that is uniform from the first principal face toward the second principal face. Second p-type area 17 has a distribution of the impurity density that is lowered from the first principal face toward the second principal face. Accordingly, second p-type area 17 has an impurity density that is higher than second n-type area 16 on the first principal face side and is lower than second n-type area 16 on the second principal face side. The other configurations are similar to those of the first embodiment.

Although not particularly limited, for example, the dimension and the impurity density of each part of the semiconductor device according to the second embodiment have the following values. The width of second n-type area 16 is 4.0 μm, and the impurity density of second n-type area 16 is $1.0 \times 10^{15}$ cm$^{-3}$. The width of second p-type area 17 is 4.0 μm. The repetition pitch P2 of second parallel p-n layer 15 is 8.0 μm. The impurity density of second p-type area 17 is $0.7 \times 10^{15}$ cm$^{-3}$, $0.9 \times 10^{15}$ cm$^{-3}$, $1.1 \times 10^{15}$ cm$^{-3}$, and $1.3 \times 10^{15}$ cm$^{-3}$ from the second principal face side toward the first principal face side in a stepwise manner. The other configurations are similar to those of the first embodiment.

According to the second embodiment, the same advantages as those of the first embodiment are acquired. In addition, according to the second embodiment, since second parallel p-n layer 15 having a repetition pitch that is smaller than that of first parallel p-n layer 12 is disposed, the depletion layer may easily grow in element peripheral edge part 3. Accordingly, a breakdown voltage that is higher than that of element activating part 1 can be maintained in element peripheral edge part 3. Therefore, a high breakdown voltage can be easily realized.

Third Embodiment

Figure 12:
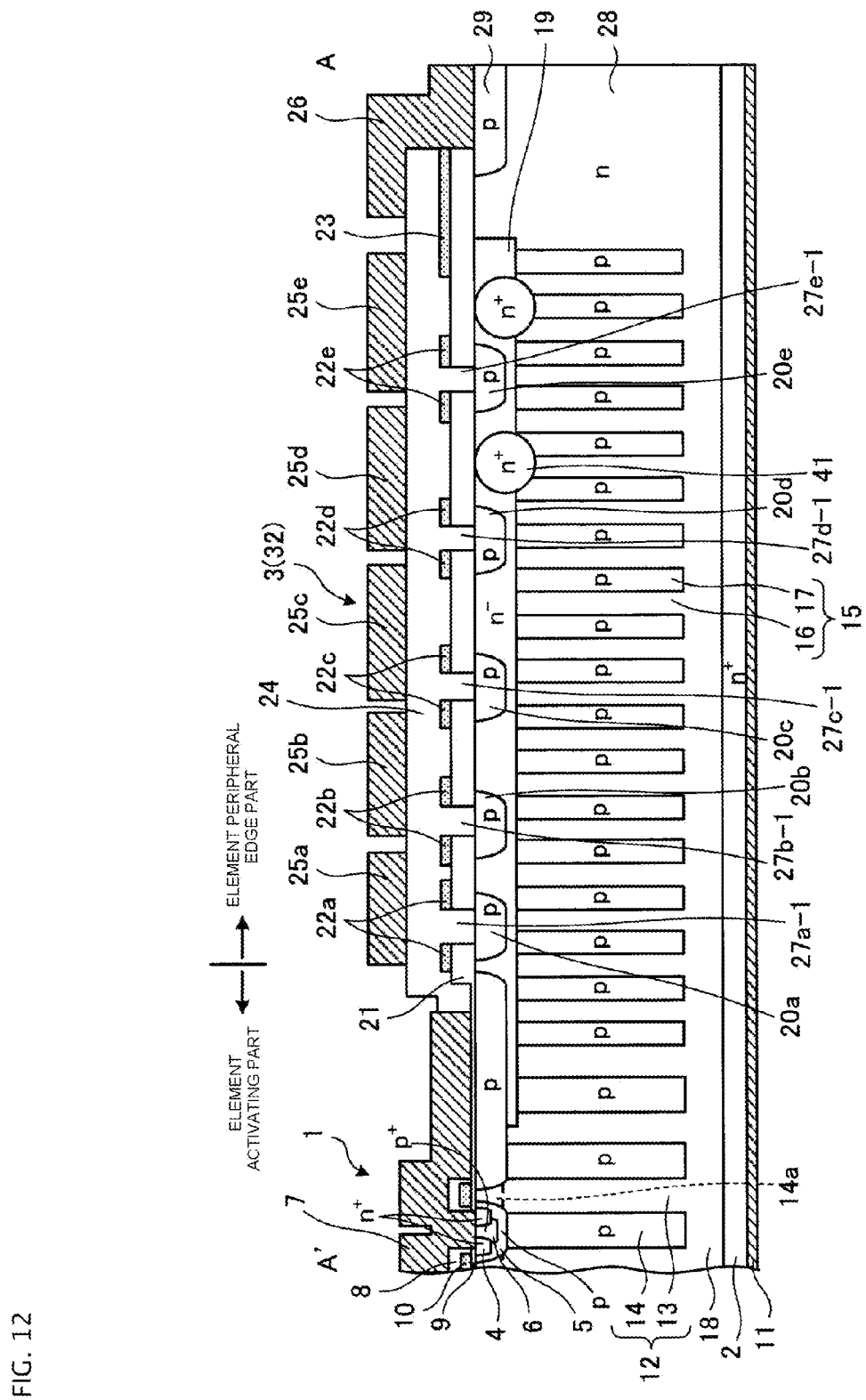
FIG. 12 is a longitudinal cross-sectional view of the semiconductor device according to the third embodiment, which is taken along line A-A' illustrated in FIG. 11.
Figure 13:
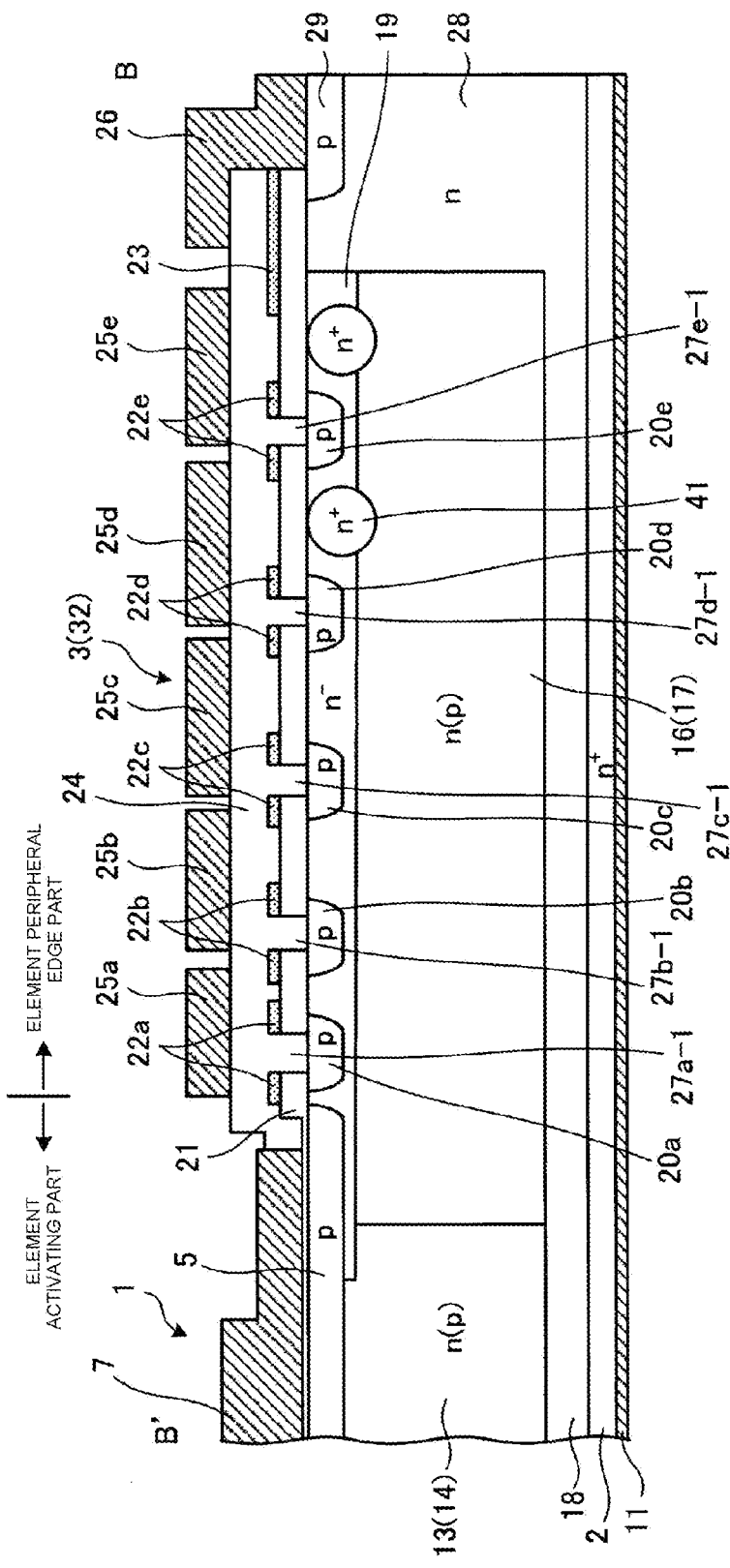
FIG. 13 is a longitudinal cross-sectional view of the semiconductor device according to the third embodiment, which is taken along line B-B' illustrated in FIG. 11.
Figure 14:
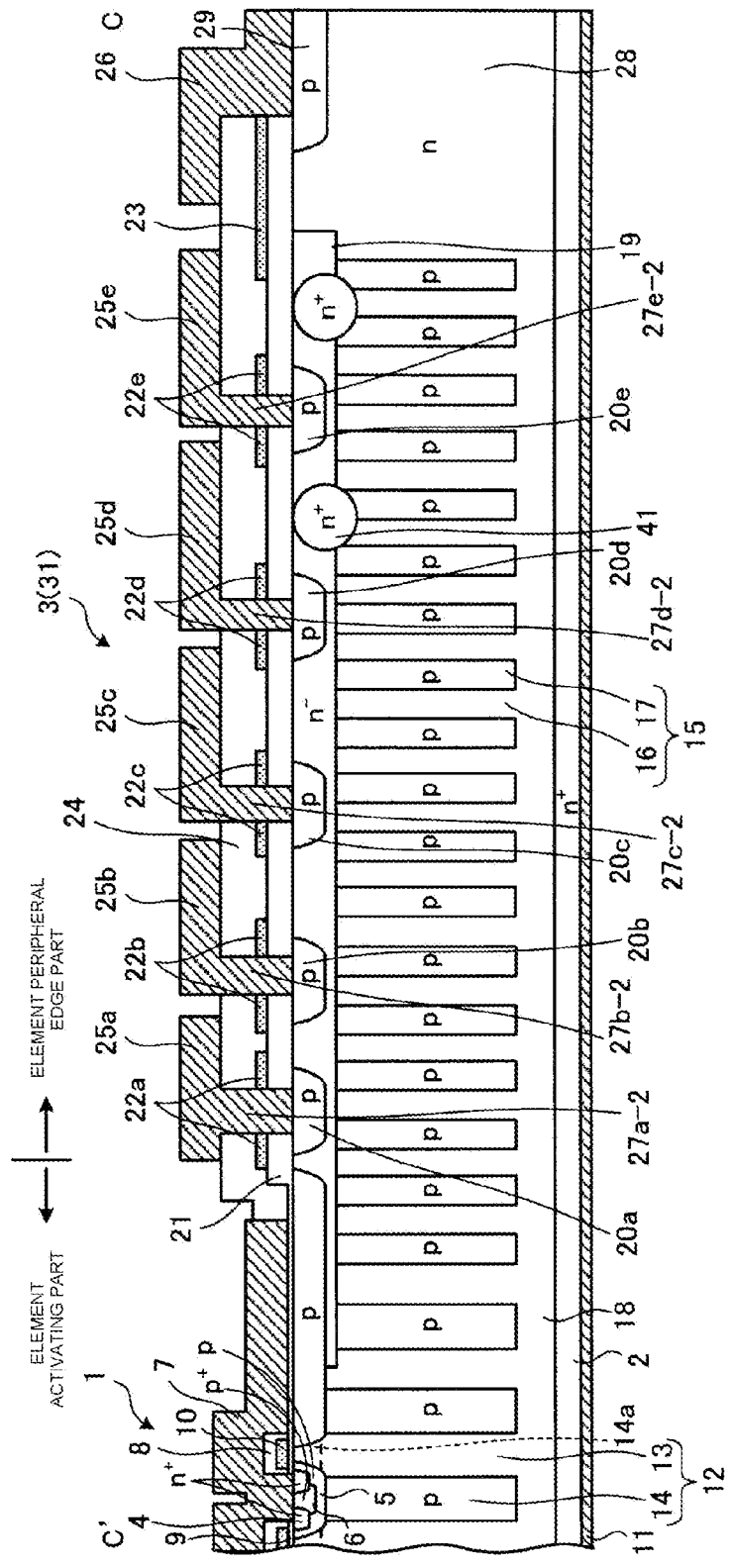
FIG. 14 is a longitudinal cross-sectional view of the semiconductor device according to the third embodiment, which is taken along line C-C' illustrated in FIG. 11.

FIG. 11 is a plan view of a semiconductor device according to a third embodiment. FIG. 12 is a longitudinal cross-sectional view of the semiconductor device according to the third embodiment, which is taken along line A-A' illustrated in FIG. 11. FIG. 13 is a longitudinal cross-sectional view of the semiconductor device according to the third embodiment, which is taken along line B-B' illustrated in FIG. 11. FIG. 14 is a longitudinal cross-sectional view of the semiconductor device according to the third embodiment, which is taken along line C-C' illustrated in FIG. 11. As illustrated in FIGS. 11 to 14, a difference between the third embodiment and the second embodiment is that n⁺ high density area 41 of which the impurity density is higher than n⁻ surface area 19 is arranged on n⁻ surface area 19 in the third embodiment.

N⁺ high density area 41, for example, is disposed between p-type guard ring area 20d and p-type guard ring area 20e and between p-type guard ring area 20e and first channel stopper electrode 23. N⁺ high density area 41 passes through n⁻ surface area 19 from the first principal face side and reaches second p-type area 17. Although not particularly limited, for example, the diffusion depth of n⁺ high density area 41 is 5.0 μm, and the center impurity density of n⁺ high density area 41 is $1.0 \times 10^{16}$ cm$^{-3}$. The other configurations are similar to those of the second embodiment.

According to the third embodiment, the same advantages as those of the first embodiment are acquired. In addition, according to the third embodiment, since the impurity density of n⁺ high density area 41 is higher than the impurity density of n⁻ surface area 19, the expansion of depletion layer 3 can be suppressed near the outer circumference of element peripheral edge part 3. Accordingly, even in a case where the length of each one of first field plates 22c, 22d, and 22e that overhang in the direction of the inner circumference is short, the voltages applied between p-type guard ring areas 20a, 20b, 20c, 20d, and 20e can be made uniform. In other words, according to the third embodiment, the electric charge resistance of the breakdown voltage can be improved by further increasing the spaces between p-type guard ring areas 20a, 20b, 20c, 20d, and 20e that are adjacent to each other toward the terminal of element peripheral edge part 3 and arranging n⁺ high density area 41 in n⁻ surface area 19.

Fourth Embodiment

Figure 15:
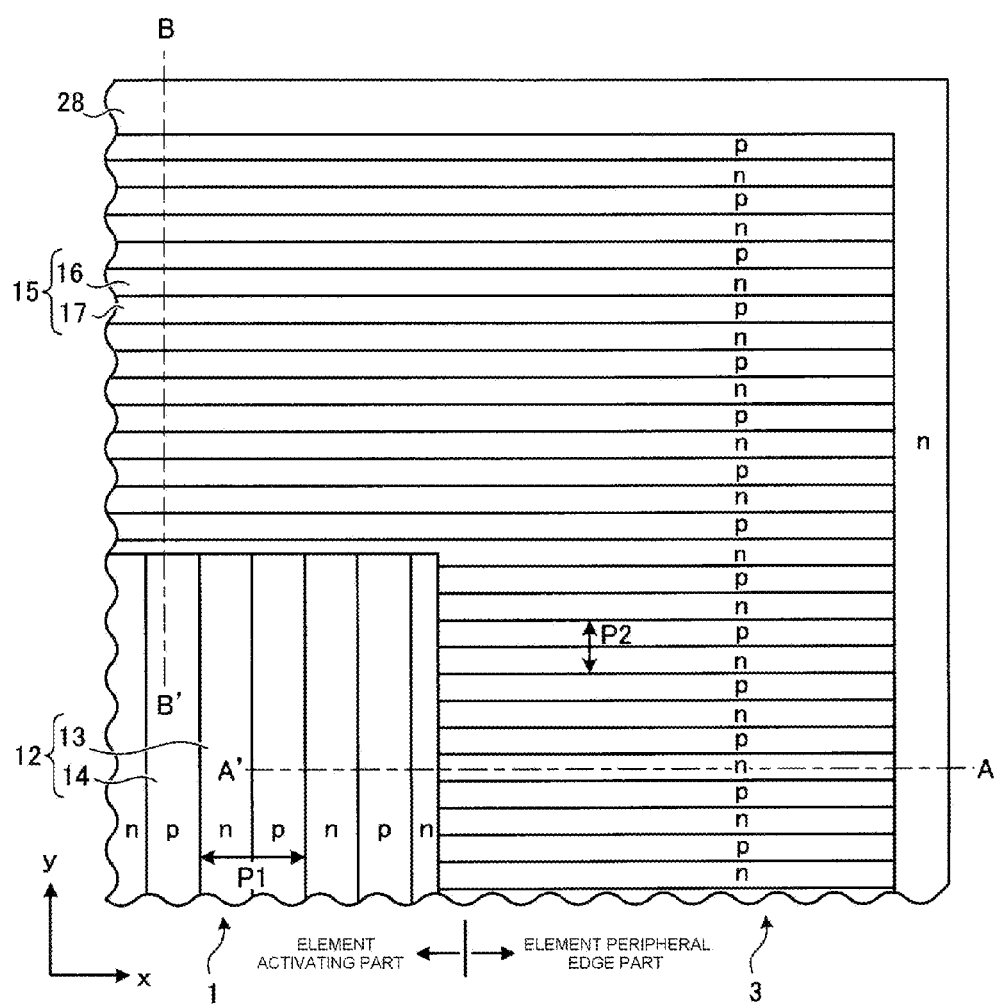
FIG. 15 is a transverse cross-sectional view of a semiconductor device according to a fourth embodiment.
Figure 16:
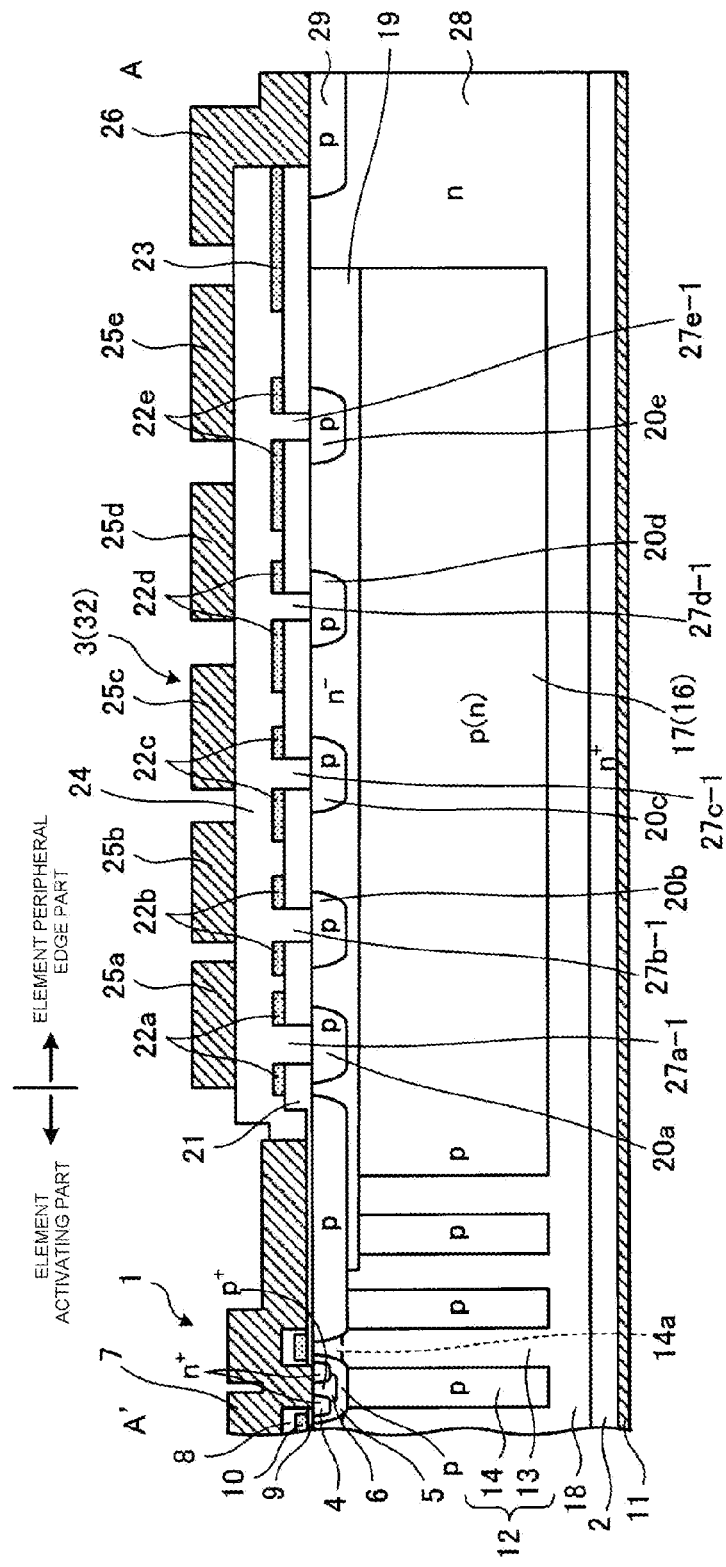
FIG. 16 is a longitudinal cross-sectional view of the semiconductor device according to the fourth embodiment, which is taken along line A-A' illustrated in FIG. 15.
Figure 17:
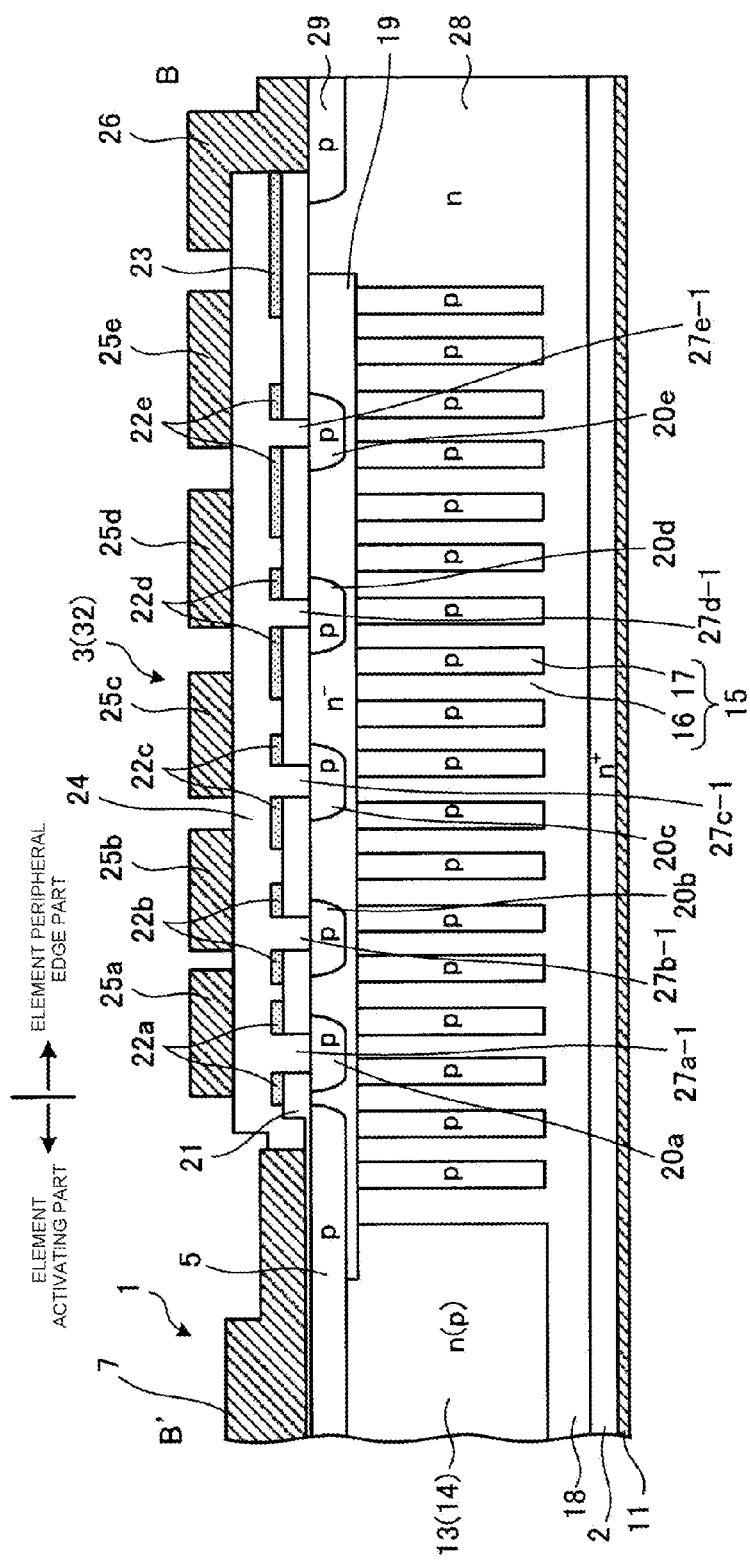
FIG. 17 is a longitudinal cross-sectional view of the semiconductor device according to the fourth embodiment, which is taken along line B-B' illustrated in FIG. 15.

FIG. 15 is a transverse cross-sectional view of a semiconductor device according to a fourth embodiment. FIG. 16 is a longitudinal cross-sectional view of the semiconductor device according to the fourth embodiment, which is taken along line A-A' illustrated in FIG. 15. FIG. 17 is a longitudinal cross-sectional view of the semiconductor device according to the fourth embodiment, which is taken along line B-B' illustrated in FIG. 15. The longitudinal cross-sectional view taken along line C-C' illustrated in FIG. 15 is similar to the longitudinal cross-sectional view illustrated in FIG. 10. As illustrated in FIGS. 15 to 17, a difference between the third embodiment and the second embodiment is that the direction of stripes of second parallel p-n layer 15 is different from the direction of stripes of first parallel p-n layer 12 in the third embodiment. For example, the direction of stripes of second parallel p-n layer 15 may be perpendicular to the direction of stripes of first parallel p-n layer 12. The other configurations are similar to those of the second embodiment.

According to the fourth embodiment, the same advantages as those of the second embodiment are acquired. In other words, even in a case where there is a difference between the directions of the parallel p-n layers of first parallel p-n layer 12 and second parallel p-n layer 15, when the structure of element peripheral edge part 3 is the same, similarly to the second embodiment, the advantage of improved electric charge resistance of the breakdown voltage is acquired. In addition, even in a case where the parallel p-n layer has a configuration in which a p-type area of which the planar shape is a square, a polygon, or a circle is arranged in second parallel p-n layer 15, when the structure of element peripheral edge part 3 is the same, similarly to the second embodiment, an advantage of improved electric charge resistance of the breakdown voltage is acquired. The configuration of the fourth embodiment may be applied to the first or third embodiment.

Fifth Embodiment

Figure 19:
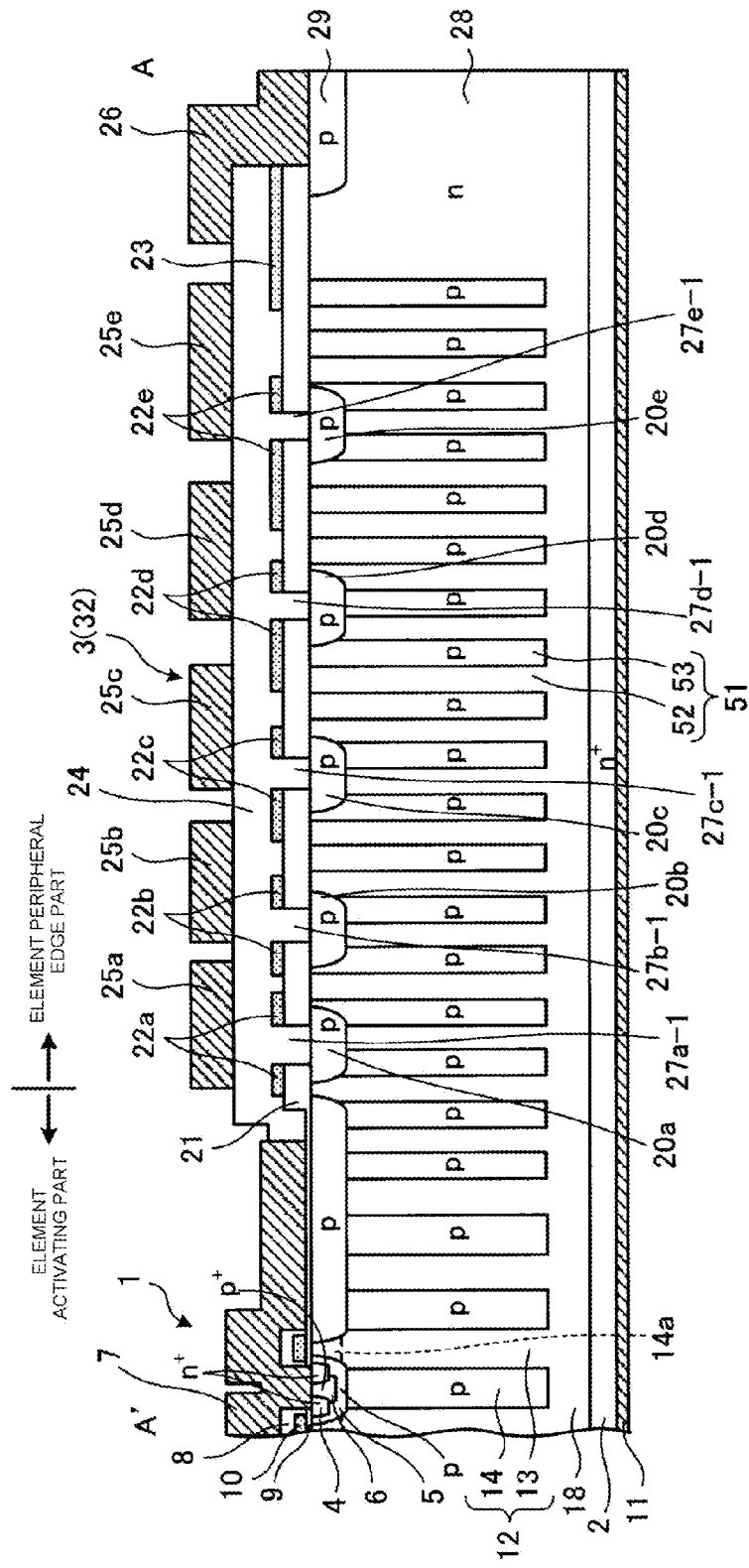
FIG. 19 is a longitudinal cross-sectional view of the semiconductor device according to the fifth embodiment, which is taken along line A-A' illustrated in FIG. 18.
Figure 20:
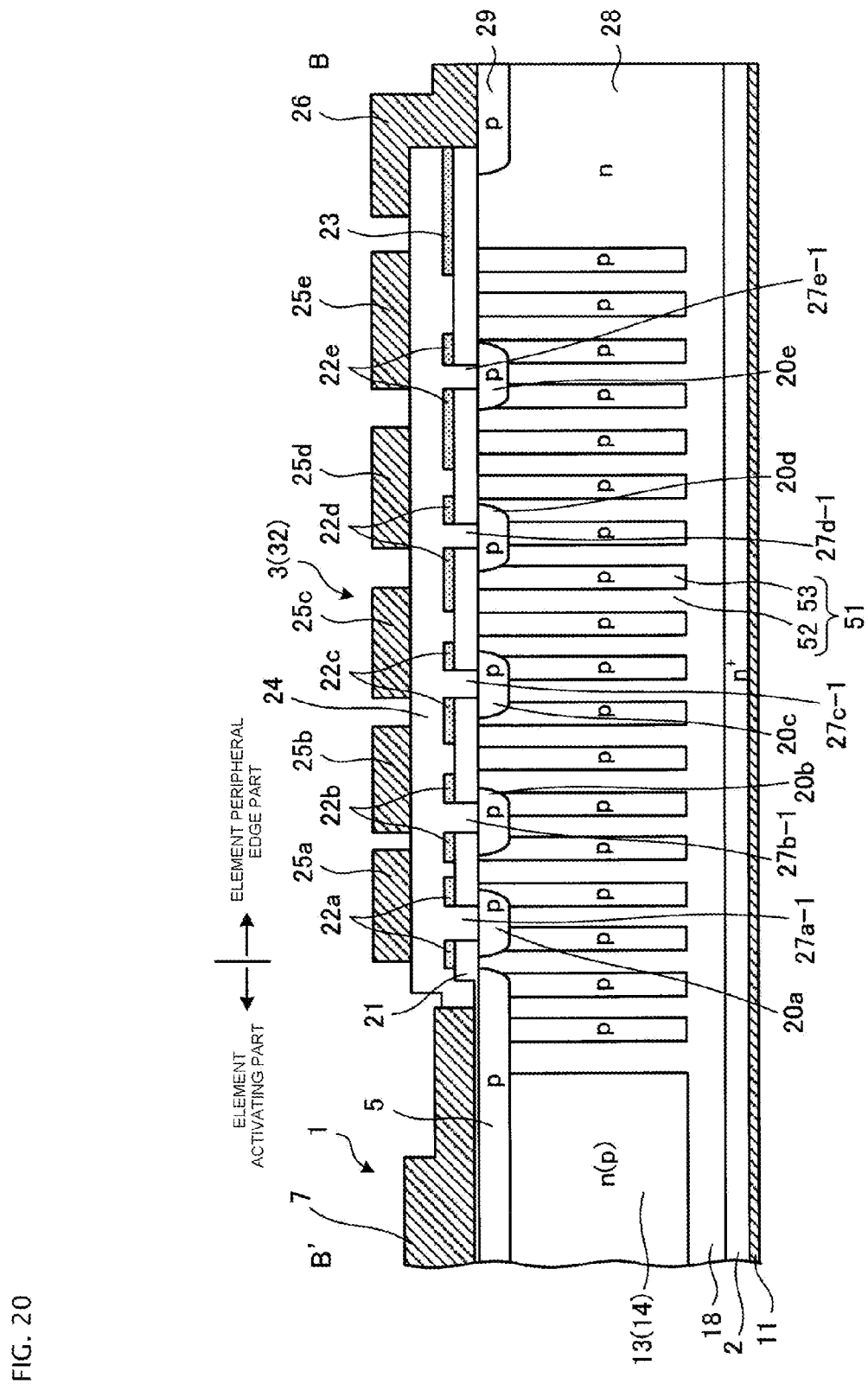
FIG. 20 is a longitudinal cross-sectional view of the semiconductor device according to the fifth embodiment, which is taken along line B-B' illustrated in FIG. 18.
Figure 21:
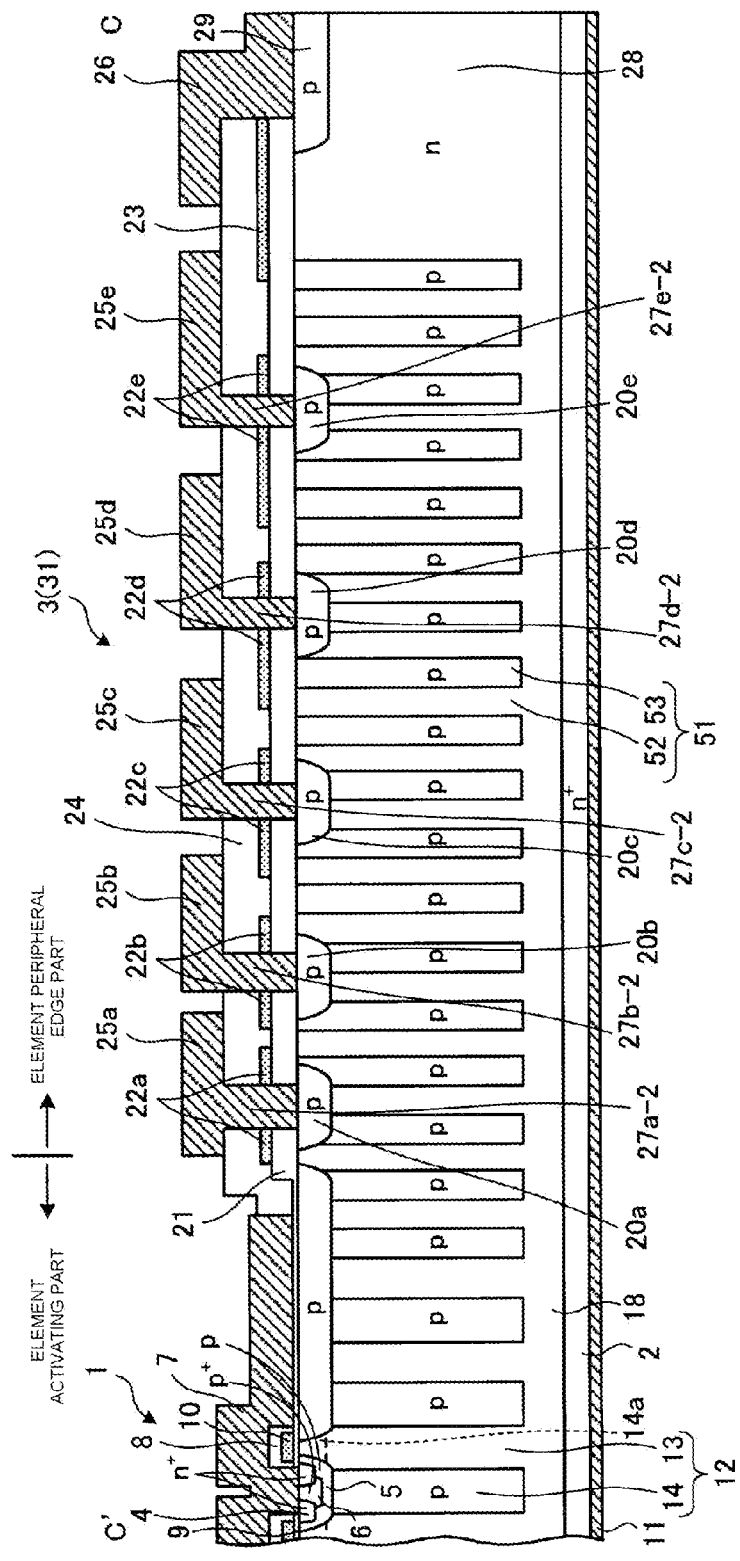
FIG. 21 is a longitudinal cross-sectional view of the semiconductor device according to the fifth embodiment, which is taken along line C-C' illustrated in FIG. 18.

FIG. 18 is a plan view of a semiconductor device according to a fifth embodiment. FIG. 19 is a longitudinal cross-sectional view of the semiconductor device according to the fifth embodiment, which is taken along line A-A' illustrated in FIG. 18. FIG. 20 is a longitudinal cross-sectional view of the semiconductor device according to the fifth embodiment, which is taken along line B-B' illustrated in FIG. 18. FIG. 21 is a longitudinal cross-sectional view of the semiconductor device according to the fifth embodiment, which is taken along line C-C' illustrated in FIG. 18. As illustrated in FIGS. 18 to 21, differences between the fifth embodiment and the second embodiment lie in the following two points. A first point is that second parallel p-n layer 51 having a configuration is arranged in which p-type area 53, of which the planar shape is a square or a polygon, is arranged in n-type area 52. P-type areas 53 are arranged in a matrix pattern, so that n-type areas 52 form a planar shape that is a lattice pattern. A second point is that an n⁻ surface area is not disposed between second parallel p-n layer 51 and the first principal face. In element peripheral edge part 3, similarly to element activating part 1, second parallel p-n layer 51 is formed up to the first principal face. In FIG. 18, second parallel p-n layer 51 is denoted by dotted lines.

Although not particularly limited, for example, the dimension and the impurity density of each part of the semiconductor device according to the fifth embodiment have the following values. The impurity density of the second p-type area 17 is $0.7 \times 10^{15}$ cm⁻³, $0.9 \times 10^{15}$ cm⁻³, $1.1 \times 10^{15}$ cm⁻³, $1.3 \times 10^{15}$ cm⁻³, and $1.5 \times 10^{15}$ cm⁻³ from the second principal face side toward the first principal face side in a stepwise manner. In element peripheral edge part 3, since an n⁻ surface area is not disposed between second p-type area 17 and the first principal face side, second p-type area 17 has a distribution of the impurity density that increases by five levels from the second principal face toward the first principal face. The surface impurity density of each one of p-type guard ring areas 20a, 20b, 20c, 20d, and 20e is $3.0 \times 10^{17}$ cm⁻³. The surface impurity density of a p-well area (p-base area 5) is $3.0 \times 10^{17}$ cm⁻³. The width of n-type channel stopper area 28 is 28.0 μm. The impurity density of p-type outermost circumferential area 29 is $3.0 \times 10^{17}$ cm⁻³. The other configurations are similar to those of the second embodiment.

In the fifth embodiment, similarly to the example illustrated in FIG. 7, even in a case where there is positive electric charge (positive ions) of $+1.0 \times 10^{12}$ cm⁻² or more on first insulating film 21 between the field plate electrode and the channel stopper electrode or negative electric charge (negative ions) of $-1.0 \times 10^{12}$ cm⁻² or less, the breakdown voltage hardly changes. Accordingly, it is understood that the semiconductor device according to the fifth embodiment has a breakdown voltage that is higher than that of the conventional example, and the electric charge resistance of the breakdown voltage is improved.

According to the fifth embodiment, similar advantages to those of the second embodiment are acquired. In addition, according to the fifth embodiment, since second parallel p-n layer 51 has a configuration in which p-type areas 53, of which the planar shape is a square, are arranged in a matrix pattern in n-type area 52 of element peripheral edge part 3, a depletion layer easily spreads uniformly toward the outer circumference of element peripheral edge part 3. Accordingly, a breakdown voltage can be secured without disposing the n⁻ surface area, and the electric charge resistance of the breakdown voltage can be remarkably improved.

Sixth Embodiment

Figure 22:
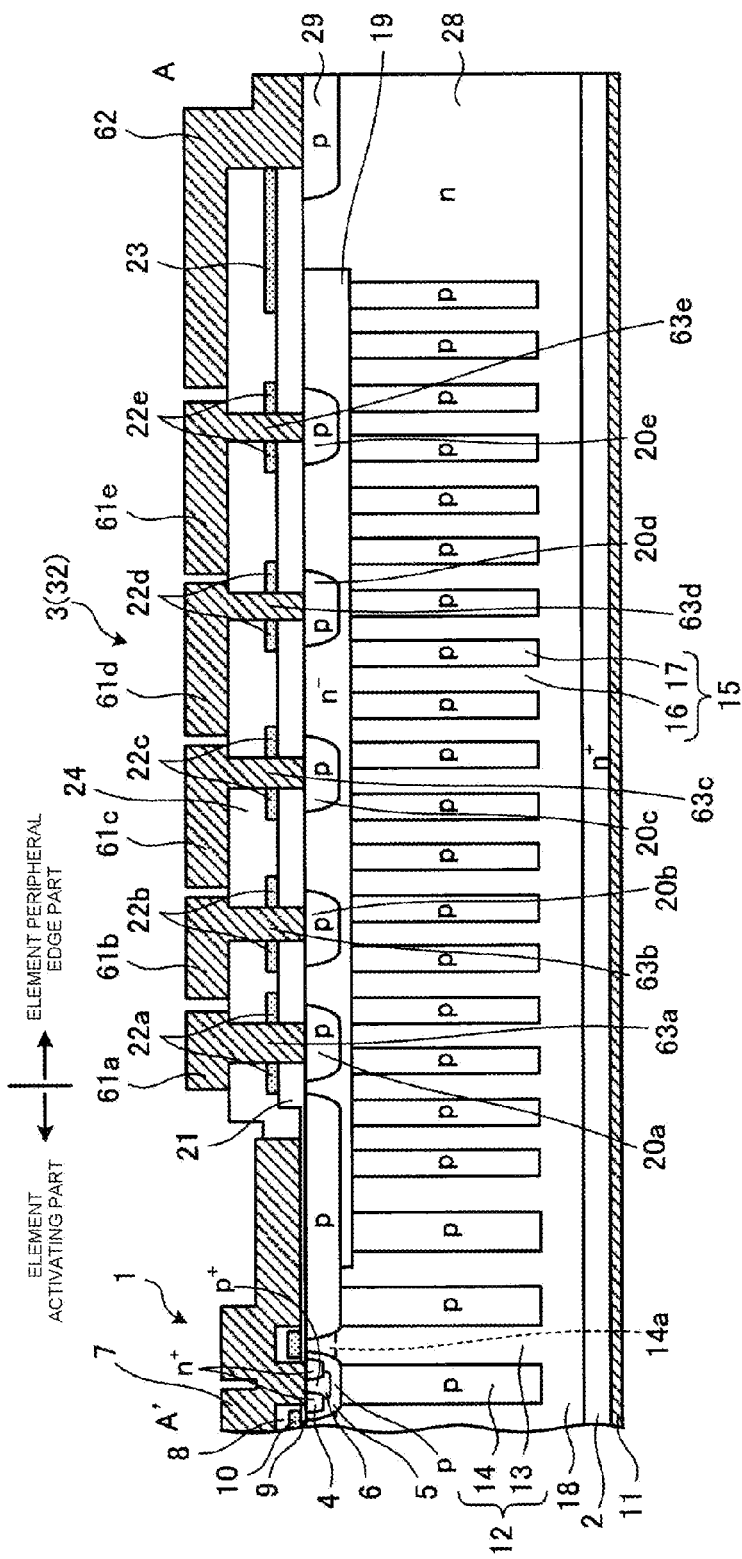
FIG. 22 is a longitudinal cross-sectional view of a semiconductor device according to a sixth embodiment.

FIG. 22 is a longitudinal cross-sectional view of a semiconductor device according to a sixth embodiment. The longitudinal cross-sectional view illustrated in FIG. 22, for example, as illustrated in FIG. 22, corresponds to the longitudinal cross-sectional view taken along line A-A' illustrated in FIG. 8. A difference between the sixth embodiment and the second embodiment is that second field plate electrodes 61a, 61b, 61c, 61d, and 61e overhang a bonding portion between p-type guard ring areas 20a, 20b, 20c, 20d, and 20e that are electrically connected thereto and n⁻ surface area 19 on the first principal face in the inner circumferential direction. Second field plate electrodes 61a, 61b, 61c, 61d, and 61e overlap first field plate electrodes 22a, 22b, 22c, and 22d that are adjacent to each other in the inner circumferential direction through second insulating film 24. In addition, second channel stopper electrode 62 overlaps first channel stopper electrode 23 through second insulating film 24. The widths of first field plate electrodes 22a, 22b, 22c, 22d, and 22e are the same and do not increase toward the terminal of element peripheral edge part 3. The other configurations are similar to those of the second embodiment. In addition, the sixth embodiment can be applied to the first and third to fifth embodiments. According to the sixth embodiment, by allowing second field plate electrodes 61a, 61b, 61c, 61d, and 61e to overhang the inner circumferential side, similar advantages to those of the first to fifth embodiments are acquired. In the longitudinal cross-sectional view illustrated in FIG. 22, although contact portions 63a, 63b, 63c, 63d, and 63e that connect second field plate electrodes 61a, 61b, 61c, 61d, and 61e and p-type guard ring areas 20a, 20b, 20c, 20d, and 20e are arranged in a linear portion of element peripheral edge part 3, similarly to the first to fifth embodiments, the contact portions may be disposed on the corner portion of element peripheral edge part 3.

The present invention described above is not limited to the above-described embodiments, and various changes can be made therein. For example, the dimension, the density, and the like described in the embodiments are examples, and the present invention is not limited thereto. In addition, in each embodiment, although it is configured such that the first conductivity type is the n type and the second conductivity type is the p type, even in a case where the first conductivity type is the p type, and the second conductivity type is the n type, the present invention is similarly formed. Furthermore, the present invention is not limited to a MOSFET but can be applied to an IGBT, a bipolar transistor, a free wheeling diode (FWD), or a Schottky barrier diode.

As above, the semiconductor device according to the present invention is useful for a high-power semiconductor device, and more particularly, is appropriate to a semiconductor device that can achieve the implementation of both a high breakdown voltage and a large current capacity such as a MOSFET, an IGBT, a bipolar transistor, an FWD, or a Schottky barrier diode that has a parallel p-n structure in a drift part.

Thus, a semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

1 element activating part
2 n⁺ drain area (low resistance layer)

3 element peripheral edge part
4 n+ source area
5 p-base area
6 p+ contact area
7 source electrode
8 interlayer insulating film
9 gate insulating film
10 gate electrode
11 drain electrode
12 first parallel p-n layer
13 first n-type area
14 first p-type area
15 second parallel p-n layer
16 second n-type area
17 second p-type area
18 n buffer layer
19 n⁻ surface area
20a, 20b, 20c, 20d, 20e p-type guard ring area
21 first insulating film
22a, 22b, 22c, 22d, 22e first field plate electrode
23 first channel stopper electrode
24 second insulating film
25a, 25b, 25c, 25d, 25e second field plate electrode
26 second channel stopper electrode
27a-2, 27b-2, 27c-2, 27d-2, 27e-2 contact portion
28 n-type channel stopper area
29 p-type outermost circumferential area
31 corner portion of element peripheral edge part

What is claimed is:

1. A semiconductor device comprising:
an element activating part that is disposed on a first principal face side;
an element peripheral edge part that surrounds the element activating part;
a low-resistance layer that is disposed on a second principal face side;
a parallel p-n layer, in which a first conductivity type area and a second conductivity type area are alternately arranged, disposed between a first principal face and the low-resistance layer;
a first conductivity type region disposed between the parallel p-n layer and the first principal face in the element peripheral edge part, the first conductivity type region having disposed therein two or more second conductivity type areas which are disposed to be separate from each other in the first principal face side;
two or more first conductive layers which are electrically connected to the second conductivity type areas which are disposed in the first conductivity type region and partially cover the first principal face in the element peripheral edge part; and
two or more second conductive layers which are electrically connected to the second conductivity type areas which are disposed in the first conductivity type region, and which cover the first conductive layers adjacent to each other so as to cover the first principal face between the first conductive layers through an insulating layer
wherein the first and second conductive layers completely overlie the second conductivity type areas.

2. The semiconductor device according to claim 1, wherein a space between adjacent second-conductivity type areas disposed in the first conductivity type region increases with increasing distance from the element activating part.

3. The semiconductor device according to claim 1, wherein a width of a part of the first conductive layer that is located on the element activating part side is greater toward the terminal of the element peripheral edge part than that of the second conductive layer that is connected to the second-conductivity type area to which the first conductive layer is electrically connected.

4. The semiconductor device according to claim 1, wherein the width of the second conductive layer increases toward the terminal of the element peripheral edge part.

5. The semiconductor device according to claim 1, wherein an impurity density of the first conductivity type region is $2 \times 10^{14}$ cm$^{-3}$ or more and $8 \times 10^{14}$ cm$^{-3}$ or less.

6. The semiconductor device according to claim 1, wherein the parallel p-n layer includes a first parallel p-n layer, in which a first first-conductivity type area and a first second-conductivity type area are alternately arranged, disposed in the element activating part and a second parallel p-n layer, in which a second first-conductivity type area and second second-conductivity type area are alternately arranged with a pitch that is smaller than a repetition pitch of the first first-conductivity type area and the first second-conductivity type area, disposed in the element peripheral edge part.

7. The semiconductor device according to claim 6, wherein planar shapes of the first first-conductivity type area and the first second-conductivity type area in the parallel p-n area are stripes, and planar shapes of the second first-conductivity type area and the second second-conductivity type area are stripes or a planar shape of any one of the second first-conductivity type area and the second second-conductivity type area is a square or a polygon.

8. The semiconductor device according to claim 1, wherein a first conductivity type area that has an impurity density higher than the first conductivity type region is arranged in the first conductivity type region.

9. The semiconductor device according to claim 8, wherein the first conductivity type area having the higher impurity density is disposed between adjacent second-conductivity type areas which are disposed in the first conductivity type region.

10. A semiconductor device comprising:
an element activating part that is disposed on a first principal face side;
a low-resistance layer that is disposed on a second principal face side;
a first parallel p-n layer, in which a first first-conductivity type area and a first second-conductivity type area are alternately arranged, disposed between the element activating part and the low-resistance layer;
a second parallel p-n layer, in which a second first-conductivity type area and a second second-conductivity type area are alternately arranged with a pitch that is smaller than a repetition pitch of the first first-conductivity type area and the first second-conductivity type area, disposed in an element peripheral edge part that surrounds the element activating part;
two or more third second-conductivity type areas that are disposed to be separate from each other on the first principal face side of the second parallel p-n layer;
two or more first conductive layers that are electrically connected to the third second-conductivity type areas on the first principal face side and partially cover the first principal face in the element peripheral edge part; and
two or more second conductive layers that are electrically connected to the third second-conductivity type areas and cover the first conductive layers adjacent to each other so as to cover the first principal face between the first conductive layers through an insulating layer,
wherein planar shapes of the first first-conductivity type area and the first second-conductivity type area are stripes, and a planar shape of any one of the second first-conductivity type area and the second second-conductivity type area is a square or a polygon, and
wherein the first and second conductive layers completely overlie the third second conductivity type areas.

11. The semiconductor device according to claim 10, wherein a planar shape of any one of the second first-conductive type area and the second second-conductivity type area is a lattice pattern.

12. The semiconductor device according to claim 10, wherein a space between the third second-conductivity type areas adjacent to each other further increases toward a terminal of the element peripheral edge part.

13. The semiconductor device according to claim 10, wherein a width of a part of the first conductive layer that is located on the element activating part side is further larger toward the terminal of the element peripheral edge part than that of the second conductive layer that is connected to the third second-conductivity type area to which the first conductive layer is electrically connected.

14. The semiconductor device according to claim 10, wherein the width of the second conductive layer further increases toward the terminal of the element peripheral edge part.

15. The semiconductor device according to claim 1, wherein the whole element peripheral edge part on the first principal face side is covered with the first conductive layers and the second conductive layers.

16. A semiconductor device comprising:
an element activating part that is disposed on a first principal face side;
an element peripheral edge part that surrounds the element activating part;
a low-resistance layer that is disposed on a second principal face side;
a parallel p-n layer, in which a first conductivity type area and a second conductivity type area are alternately arranged, disposed between a first principal face and the low-resistance layer;
a first conductivity type region disposed between the parallel p-n layer and the first principal face in the element peripheral edge part, the first conductivity type region having disposed therein two or more second conductivity type areas which are disposed to be separate from each other in the first principal face side;
two or more first conductive layers which are electrically connected to the second conductivity type areas which are disposed in the first conductivity type region and partially cover the first principal face in the element peripheral edge part; and
two or more second conductive layers which are electrically connected to the second conductivity type areas which are disposed in the first conductivity type region, and which cover the first conductive layers adjacent to each other so as to cover the first principal face between the first conductive layers through an insulating layer,
wherein each space between the first conductive layers which are adjacent to each other is equal to or greater than the thickness of the insulating layer.

17. A semiconductor device according to claim 16, wherein each space between the second conductive layers which are adjacent to each other is larger than the spaces of portions of first conductive layers which are adjacent to each other on the outer circumferential side, covered with the second conductive layers.

18. A semiconductor device comprising:
an element activating part that is disposed on a first principal face side;
a low-resistance layer that is disposed on a second principal face side;
a first parallel p-n layer, in which a first first-conductivity area and a first second-conductivity type area are alternately arranged, disposed between the element activating part and the low-resistance layer;
a second parallel p-n layer, in which a second first-conductivity type area and a second second-conductivity type area are alternately arranged with a pitch that is smaller than a repetition pitch of the first first-conductivity type area and the first second-conductivity type area, disposed in an element peripheral edge part that surrounds the element activating part;
two or more third second-conductivity type areas that are disposed to be separate from each other on the first principal face side of the second parallel p-n layer;
two or more first conductive layers that are electrically connected to the third second-conductivity type areas on the first principal face side and partially cover the first principal face in the element peripheral edge part; and
two or more second conductive layers that are electrically connected to the third second-conductivity type areas and cover the first conductive layers adjacent to each other so as to cover the first principal face between the first conductive layers through an insulating layer,
wherein planar shapes of the first first-conductivity type area and the first second-conductivity type area are stripes, and a planar shape of any one of the second first-conductivity type area and the second second-conductivity type area is a square or a polygon and wherein each space between the first conductive layers which are adjacent to each other is equal to or greater than the thickness the insulating layer.

19. A semiconductor device according to claim 18, wherein each space between the second conductive layers which are adjacent to each other is larger than the spaces of portions of first conductive layers which are adjacent to each other on the outer circumferential side covered with the second conductive layers.

* * * * *